United States Patent
Song et al.

(10) Patent No.: US 12,237,025 B2
(45) Date of Patent: Feb. 25, 2025

(54) MEMORY DEVICE, MEMORY SYSTEM, AND PROGRAM OPERATION METHOD THEREOF

(71) Applicant: YANGTZE MEMORY TECHNOLOGIES CO., LTD., Wuhan (CN)

(72) Inventors: Yali Song, Wuhan (CN); Xiangnan Zhao, Wuhan (CN); Ying Cui, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 184 days.

(21) Appl. No.: 18/113,617

(22) Filed: Feb. 23, 2023

(65) Prior Publication Data
US 2023/0386587 A1 Nov. 30, 2023

Related U.S. Application Data

(63) Continuation of application No. PCT/CN2022/141070, filed on Dec. 22, 2022.

(30) Foreign Application Priority Data

May 24, 2022 (CN) .................... 202210573032.5

(51) Int. Cl.
*G11C 16/34* (2006.01)
*G11C 16/10* (2006.01)
*G11C 16/24* (2006.01)

(52) U.S. Cl.
CPC ........ *G11C 16/3459* (2013.01); *G11C 16/102* (2013.01); *G11C 16/24* (2013.01)

(58) Field of Classification Search
CPC .... G11C 16/3459; G11C 16/102; G11C 16/24
See application file for complete search history.

(56) References Cited

U.S. PATENT DOCUMENTS 9,378,826 B2 * 6/2016 Lee ................... G11C 16/0483
2008/0126676 A1 5/2008 Li et al.
(Continued)

FOREIGN PATENT DOCUMENTS

CN 111326198 A 6/2020
CN 112530496 A 3/2021
(Continued)

OTHER PUBLICATIONS

International Search Report issued in corresponding International Application No. PCT/CN2022/141070, mailed Mar. 9, 2023, 3 pages.

*Primary Examiner* — Son L Mai
(74) *Attorney, Agent, or Firm* — BAYES PLLC

(57) ABSTRACT

A memory device, a memory system, and a program operation method are disclosed. In one example, at an $i^{th}$ programming loop, in response to determining that index i is greater than or equal to a first preset value and less than an initial verification loop number corresponding to a target state of memory cells in the memory device, an $i^{th}$ programming inhibition operation may be performed on the memory cells of the target state. Index i may be a positive integer, and the initial verification loop number may indicate a programming loop number that starts a verification operation corresponding to the target state of the memory cells.

20 Claims, 11 Drawing Sheets

(56) References Cited

U.S. PATENT DOCUMENTS

2020/0303025 A1* 9/2020 Yang .................. G11C 16/26
2022/0328112 A1* 10/2022 Yang .................. G11C 16/3459

FOREIGN PATENT DOCUMENTS

| CN | 113892141 A | 1/2022 |
| CN | 114974364 A | 8/2022 |

* cited by examiner

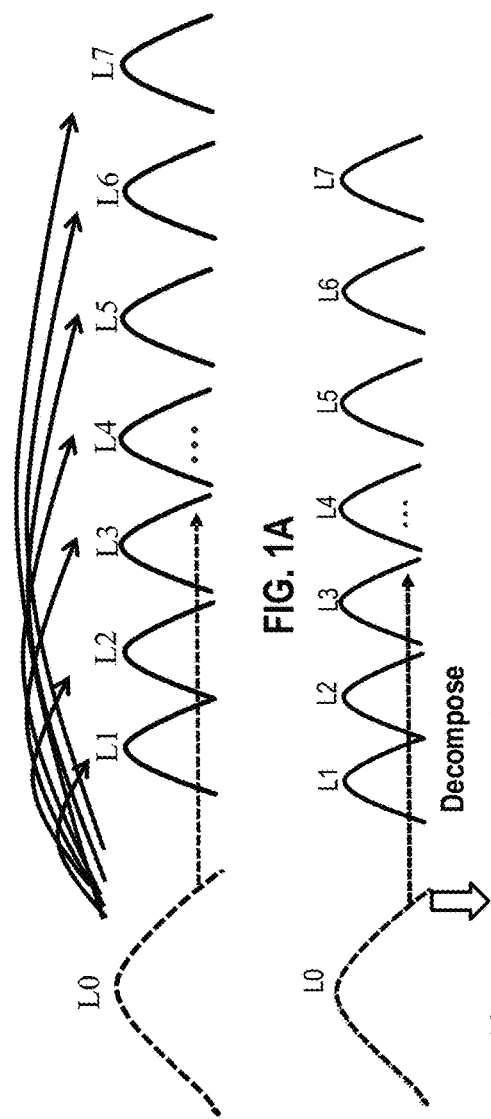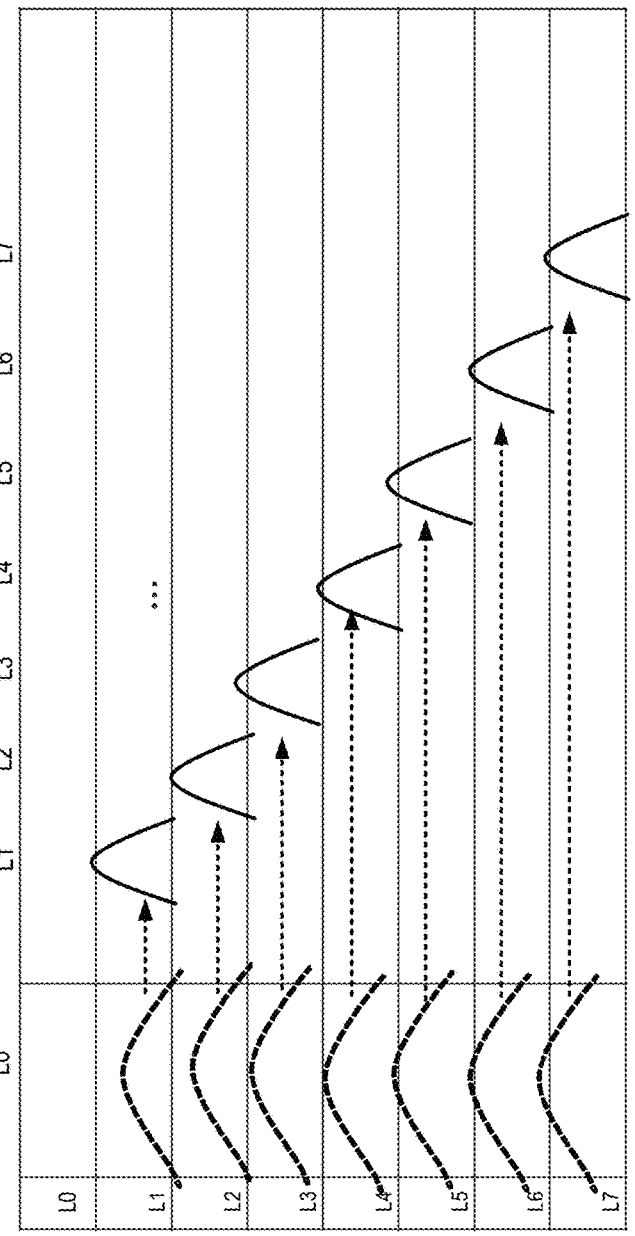

MEMORY DEVICE, MEMORY SYSTEM, AND PROGRAM OPERATION METHOD THEREOF

CROSS-REFERENCE TO RELATED APPLICATIONS

This application is a continuation of International Application No. PCT/CN2022/141070, filed on Dec. 22, 2022, entitled "MEMORY DEVICE, MEMORY SYSTEM, AND PROGRAM OPERATION METHOD THEREOF," which claims the benefit of priority to Chinese Application No. 202210573032.5, filed on May 24, 2022, both of which are incorporated herein by reference in their entireties.

BACKGROUND

The present disclosure relates to memory devices, memory systems, and program operation methods thereof.

Serving as a non-volatile memory, the NAND memory device, for example, is known for having the advantages of low cost, high capacity, fast rewrite speed, and so on. In programming the NAND memory device, typically, a one-pass or two-pass programming approach is adopted. In this approach, the program operation starts from an erased state. Each programming state is verified sequentially until the verification of all the states pass, or the maximum programming pulse count is reached, and the program operations may end.

However, as the memory cells are erased deeper, a threshold voltage distribution of the erased states may become wider. This may impact the read margin of each programming state, thereby resulting in an increase in the probability of memory read errors. For this reason, how to better program a memory device to increase the read margin of the programming states as well as to reduce the probability of memory read errors has become a crucial task in the technical field.

SUMMARY

In one aspect, the present disclosure provides a method of program operation. At an $i^{th}$ programming loop, in response to determining that index i is greater than or equal to a first preset value and less than an initial verification loop number corresponding to a target state of memory cells in the memory device, an $i^{th}$ programming inhibition operation may be performed on the memory cells of the target state. Index i may be a positive integer, and the initial verification loop number may indicate a programming loop number that starts a verification operation corresponding to the target state of the memory cells.

In some implementations, at the $i^{th}$ programming loop, performing the $i^{th}$ programming inhibition operation on the memory cells may include at the $i^{th}$ programming loop, applying an $i^{th}$ bit-line programming inhibition voltage to bit lines coupled to the memory cells to be programmed to the target state.

In some implementations, the $i^{th}$ bit-line programming inhibition voltage may include a voltage level higher than 0V.

In some implementations, the method may further include acquiring the initial verification loop number corresponding to the target state of the memory cells.

In some implementations, the method may further include, at the $i^{th}$ programming loop, in response to determining that index i is greater than or equal to 1 and less than the first preset value, performing an $i^{th}$ program operation on the memory cells of the target state.

In some implementations, at the $i^{th}$ programming loop, performing the $i^{th}$ program operation on the memory cells may include at the $i^{th}$ programming loop, applying an $i^{th}$ bit-line programming voltage to bit lines coupled to the memory cells to be programmed to the target state.

In some implementations, the $i^{th}$ bit-line programming voltage may be 0V.

In some implementations, the method may include in response to determining that, at a $p^{th}$ programming loop, the memory cells to be programmed to the target state reach the target state and pass a verification operation, performing a $(p+1)^{th}$ programming inhibition operation on the memory cells of the target state at a $(p+1)^{th}$ programming loop, p being a positive integer greater than the initial verification loop number.

In some implementations, the method may include at the $i^{th}$ programming loop, in response to determining that index i is equal to the initial verification loop number: performing an $i^{th}$ program operation on the memory cells; and after the $i^{th}$ program operation is performed, performing an $i^{th}$ verification operation on the memory cells.

In some implementations, the method may further include after the $i^{th}$ verification operation on the memory cells, generating an $i^{th}$ verification result signal indicative of a verification result corresponding to the $i^{th}$ verification operation.

In some implementations, the method may further include, in response to determining that all target states corresponding to memory cells pass verification operations, ending program operations on the memory cells of all the target states.

In some implementations, at the $i^{th}$ programming loop, performing the $i^{th}$ program operation on the memory cells may include at the $i^{th}$ programming loop, applying an $i^{th}$ bit-line programming voltage to bit lines coupled to the memory cells to be programmed to the target state.

In some implementations, the $i^{th}$ bit-line programming voltage may include a voltage level lower than a CO bit-line programming inhibition voltage in a CO programming inhibition operation. q may be a positive integer.

In some implementations, a voltage level of the $i^{th}$ bit-line programming voltage may be determined according to a difference between a required threshold voltage corresponding to the target state of the memory cells and a voltage currently stored by the memory cells.

In some implementations, the first preset value may be identical for all target states of memory cells in the memory device.

In some implementations, the first preset value may be 2.

In some implementations, the first preset value may include a difference between the initial verification loop number and a second preset value. The second preset value may include a positive integer.

In some implementations, the second preset value may include an integer selected from 1 to 5.

In some implementations, the second preset value may be 4.

In some implementations, the initial verification loop number may be a first initial verification loop number, and the target state may be a first target state. The first preset value may include a second initial verification loop number. The second initial verification loop number may indicate a programming loop number that starts a verification operation corresponding to a second target state of memory cells in the memory device. The second target state may be a state lower than the first target state.

In some implementations, the first target state may be an $x^{th}$ state, and the second target state may be an $(x-j)^{th}$ state. x may include an integer that is greater than or equal to 2 and less than or equal to a total number L of all target states of memory cells in the memory device, and j may include a positive integer such that a value of (x−j) is greater than 1.

In some implementations, when L is equal to 7, j may be selected from 1 to 5; and when L is equal to 15, j may be selected from 1 to 10.

In another aspect, the present disclosure provides a memory device. The memory device may include a plurality of memory cells and peripheral circuits coupled to the plurality of memory cells. The peripheral circuits may be configured to at an $i^{th}$ programming loop, in response to determining that index i is greater than or equal to a first preset value and less than an initial verification loop number corresponding to a target state of memory cells in the memory device, perform an $i^{th}$ programming inhibition operation on the memory cells of the target state. Index i may be a positive integer, and the initial verification loop number may indicate a programming loop number that starts a verification operation corresponding to the target state of the memory cells.

In some implementations, the peripheral circuits may be further configured to at the $i^{th}$ programming loop, apply an $i^{th}$ bit-line programming inhibition voltage to bit lines coupled to the memory cells to be programmed to the target state.

In some implementations, the $i^{th}$ bit-line programming inhibition voltage may include a voltage level higher than 0V.

In some implementations, the peripheral circuits may be further configured to acquire the initial verification loop number corresponding to the target state of the memory cells.

In some implementations, the peripheral circuits may be further configured to at the $i^{th}$ programming loop, in response to determining that index i is greater than or equal to 1 and less than the first preset value, perform an $i^{th}$ program operation on the memory cells of the target state.

In some implementations, the peripheral circuits may be further configured to at the $i^{th}$ programming loop, in response to determining that index i is greater than or equal to 1 and less than the first preset value, apply an $i^{th}$ bit-line programming voltage to bit lines coupled to the memory cells to be programmed to the target state.

In some implementations, the $i^{th}$ bit-line programming voltage may be 0V.

In some implementations, the peripheral circuits may be further configured to: in response to determining that, at a $p^{th}$ programming loop, the memory cells to be programmed to the target state reach the target state and pass a verification operation, perform a $(p+1)^{th}$ programming inhibition operation on the memory cells of the target state at a $(p+1)^{th}$ programming loop. p may be a positive integer greater than the initial verification loop number.

In some implementations, the peripheral circuits may be further configured to, at the $i^{th}$ programming loop, in response to determining that index i is equal to the initial verification loop number: perform an $i^{th}$ program operation on the memory cells; and after the $i^{th}$ program operation is performed, perform an $i^{th}$ verification operation on the memory cells.

In some implementations, the peripheral circuits may be further configured to after the $i^{th}$ verification operation on the memory cells, generate an $i^{th}$ verification result signal indicative of a verification result corresponding to the $i^{th}$ verification operation.

In some implementations, the peripheral circuits may be further configured to, in response to determining that all target states corresponding to memory cells pass verification operations, end program operations on the memory cell of all the target states.

In some implementations, the peripheral circuits may be further configured to at the $i^{th}$ programming loop, apply an $i^{th}$ bit-line programming voltage to bit lines coupled to the memory cells to be programmed to the target state.

In some implementations, the $i^{th}$ bit-line programming voltage may include a voltage level lower than a CO bit-line programming inhibition voltage in a CO programming inhibition operation. q may be a positive integer.

In some implementations, a voltage level of the $i^{th}$ bit-line programming voltage may be determined according to a difference between a required threshold voltage corresponding to the target state of the memory cells and a voltage currently stored by the memory cells.

In some implementations, the first preset value may be identical for all target states of memory cells in the memory device.

In some implementations, the first preset value may be 2.

In some implementations, the first preset value may include a difference between the initial verification loop number and a second preset value. The second preset value may include a positive integer.

In some implementations, the second preset value may include an integer selected from 1 to 5.

In some implementations, the second preset value may be 4.

In some implementations, the initial verification loop number may be a first initial verification loop number, and the target state may be a first target state. The first preset value may include a second initial verification loop number. The second initial verification loop number may indicate a programming loop number that starts a verification operation corresponding to a second target state of memory cells in the memory device. The second target state may be a state lower than the first target state.

In some implementations, the first target state may be an $x^{th}$ state, and the second target state may be an $(x-j)^{th}$ state. x may include an integer that is greater than or equal to 2 and less than or equal to a total number L of all target states of memory cells in the memory device, and j may include a positive integer such that a value of (x−j) is greater than 1.

In some implementations, when L is equal to 7, j is selected from 1 to 5; and when L is equal to 15, j is selected from 1 to 10.

In some implementations, the memory device may be a three-dimensional (3D) memory device.

In still another aspect, the present disclosure provides a memory system. The memory system may include one or more memory devices. Each memory device may include a plurality of memory cells; and peripheral circuits coupled to the plurality of memory cells. The peripheral circuits may be configured to at an $i^{th}$ programming loop, in response to determining that index i is greater than or equal to a first preset value and less than an initial verification loop number corresponding to a target state of memory cells in the memory device, perform an $i^{th}$ programming inhibition operation on the memory cells of the target state. Index i may be a positive integer, and the initial verification loop number may indicate a programming loop number that starts a verification operation corresponding to the target state of the memory cells.

In some implementations, each of the one or more memory devices may include a three-dimensional (3D) memory device.

In still another aspect, the present disclosure provides another method of program operation performed on a memory device. A range including a lower bound and an upper bound may be acquired. Each of the lower and upper bounds may include a positive integer. The upper bound may be greater than or equal to the lower bound and include an initial verification loop number minus 1. The initial verification loop number may indicate a programming loop number that starts a verification operation corresponding to a target state of memory cells. A programming inhibition operation may be performed on the memory cells of the target state for each programming loop from a $p^{th}$ programming loop to a $q^{th}$ programming loop. p may be equal to the lower bound, and q may be equal to the upper bound.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 1A and 1B are schematic diagrams illustrating a one-pass program operation method.

Figure 2A:
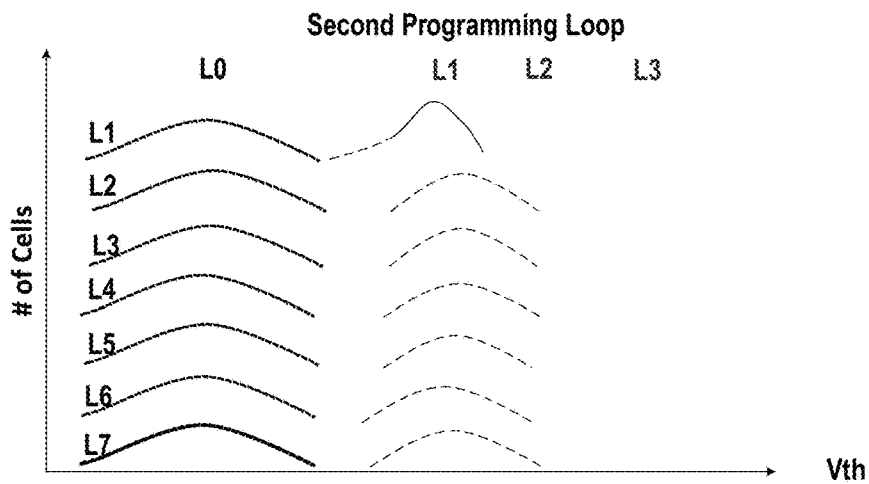
FIG. 2A-2C illustrates a comparison of exemplary program operation methods.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the terms "based on" and "according to" may be understood as not necessarily intended to convey an exclusive set of factors and may, instead, allow for the existence of additional factors not necessarily expressly described, again, depending on at least in part on the context. In addition, the term "couple," "coupled to," or "coupled between" may be understood as not necessarily intended to be "physically joined or attached," i.e., direct attachment, but can also be interpreted by indirect connection through an intermediate component.

Further, the terms "vertical" and "horizontal" may be only used for ease of description. These directions may be relative to a pre-defined coordinate system or a specific direction (e.g., a layout of a drawing). It can be understood that these directions are not absolute and are only provided for reference.

Meanwhile, the terms "first," "second," etc. in the present disclosure are used to identify objects, without any restriction to a particular order or sequence. It can also be understood that when no conflict, the technical solutions described in implementations of the present disclosure may be combined.

At the earlier age, the memory cells of the memory device were mostly single-level cells (SLCs). That is, each memory cell could only store one bit of data and had two memory states, i.e., "0" corresponding to the first range of voltages and "1" corresponding to the second range of voltages. With the development of NAND memory technology, the memory cell has gradually evolved from a single-level cell to a multi-level cell (MLC) capable of storing two bits of data. Later, the triple-level cell (TLC), capable of storing three bits of data, and even the quad-level cell (QLC), capable of storing four bits of data, were also introduced. Correspondingly, the memory states that the memory cell of a NAND memory device can hold may upgrade from 2 to 4, 8, and even 16.

For example, the TLC can be programmed to assume one of seven possible programming levels from an erased state by writing one of seven possible nominal storage values to the memory cell. An eighth nominal storage value can be used for the erased state. The erased state can be denoted as L0, and the seven programming states can be represented as L1, L2, L3, L4, L5, L6, and L7, respectively. It can be understood that the threshold voltages corresponding to the L0 to L7 states gradually increase from L0 to L7.

FIGS. 1A and 1B are schematic diagrams illustrating a one-pass program operation method applied to the TLC. As shown in FIGS. 1A and 1B, the TLC is programmed to assume one of the programming states of L1 to L7 from the erased state L0. Each programming state may be verified sequentially until the verification of the state pass, or the maximum programming pulse count is reached, and the program operations may end.

Corresponding to FIGS. 1A and 1B, TABLE 1 below shows an exemplary programming scheme that may include multiple programming loops for programming the TLC using the one-pass programming approach. Some of the programming loops may each include applying at least one programming pulse and at least one programming verification pulse (denoted as V in TABLE 1 below).

TABLE 1

| Loop | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| L1 | <u>V</u> | V | V | V | V | | | | | | | | | | | |
| L2 | | | <u>V</u> | V | V | V | V | | | | | | | | | |
| L3 | | | | | <u>V</u> | V | V | V | V | | | | | | | |
| L4 | | | | | | | <u>V</u> | V | V | V | V | V | | | | |
| L5 | | | | | | | | <u>V</u> | V | V | V | V | V | | | |
| L6 | | | | | | | | | | <u>V</u> | V | V | V | V | | |
| L7 | | | | | | | | | | | | | <u>V</u> | V | V | V |

For example, at the first programming loop, the memory cells to be programmed to the L1 target state are verified, while after the fifth programming loop, the verification operations performed on the memory cells of the L1 target state end. It can be understood that after the fifth programming loop, where the verification pulse V is applied, the verification of the L1 target state passes, and the TLC of the L1 target state may no longer be programmed. Similar techniques may be applied to the TLC to be programmed to the L2 to L7 states.

It is understood that through running the multiple programming loop operations, the memory cells in a memory device can be programmed from L0 to L1, L2, L3, L4, L5, L6, and L7 states, respectively.

In the present disclosure, for ease of description, the terms "memory cells having an Lx target state" and "memory cells of an Lx target state" may be equivalent to the term "memory cells to be programmed to an Lx target state," and all of these terms may be used to refer to those memory cells that have the Lx state as a target state and are programmed to reach a threshold voltage corresponding to the Lx state.

It is noted that the deeper a memory cell erases, the lower the threshold voltage of the L0 state will result, and thus the larger the difference between the threshold voltages of the L0 state and the L1 state will become. As a result, when the above one-pass programming scheme is used for programming the memory cells in one shot, the data retention ability of the memory cells in the target states may become poor. It thus results in a wider threshold voltage distribution from the L1 state to the L7 state, and a worse read margin, between two adjacent programming states, may be obtained.

On the other hand, the shallower a memory cell erases, the higher the threshold voltage of the L0 state will become, and the smaller the difference between the threshold voltages of the L0 state and the L1 state will be. That is, when the one-pass programming scheme is applied, the data retention ability of the memory cells in the target states is better. However, due to the small difference between the threshold voltages of the L0 state and the L1 state, their spectrums may overlap, resulting in deterioration in the read margin of the L0 and L1 states accordingly.

Moreover, at each programming loop of the one-pass programming approach, programming pulses may be required to be simultaneously applied to all unverified memory cells. That is, only when the verification of a memory cell of the programming state passes, a programming inhibition pulse can be applied to the memory cell that passed the verification (shown as backslashes in TABLE 1).

For example, in TABLE 1 above, at the first programming loop, a first programming pulse may be applied to the memory cells to be programmed to the L1~L7 states simultaneously. After the fifth programming loop, the verification of the L1 state passes. At the sixth programming loop, a sixth programming pulse may be applied to the memory cells to be programmed to the L2~L7 states, respectively, and the memory cells that reached the L1 state may be inhibited from being programmed. More specifically, the term "programming pulse . . . applied to the memory cells" above may be used to describe that a programming pulse may be applied to a word line coupled to the memory cell to be programmed to the target state, and/or a bit-line programming pulse may be applied to a bit line coupled to the memory cell to be programmed to the target state. Details of the program operation will be explained in the following description.

Figure 2B:
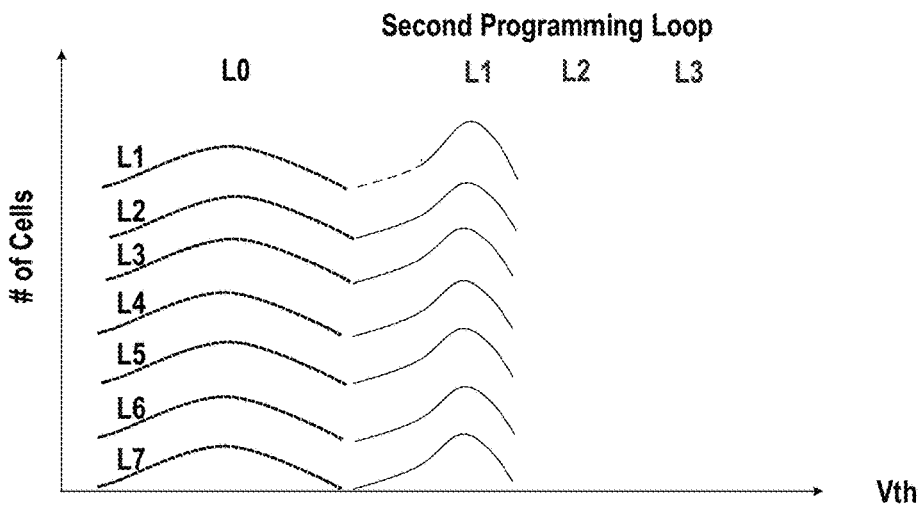
Figure 2C:
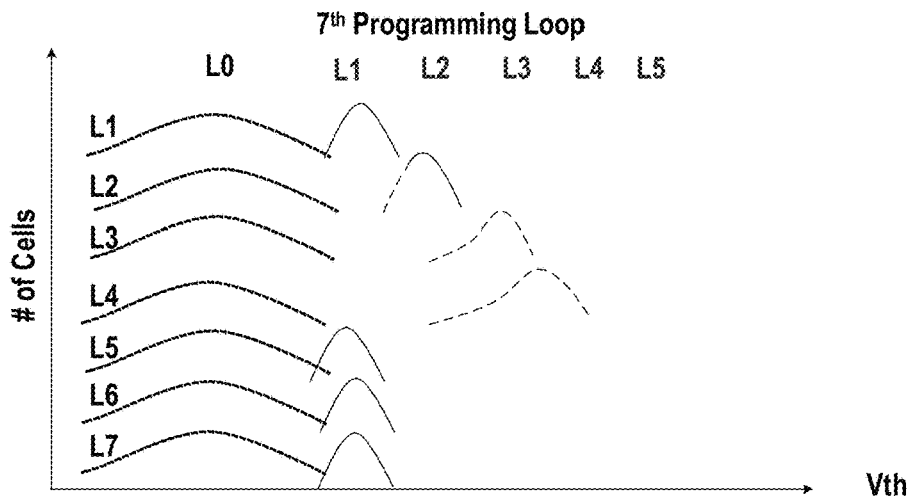

FIG. 2A-2C illustrates a comparison of exemplary program operation methods. In reference to FIG. 2A, the solid curve on the right side, under "L 1," depicts the threshold voltage distribution of the memory cells having the L1 target state and having reached the L1 state after applying the first programming pulse at the first programming loop. When the second programming pulse at the second programming loop is applied, a programming inhibition pulse can be applied to these memory cells. On the other hand, the dotted curves, on the right side, represent either the threshold voltage distribution of the memory cells having the L1 target state but not reaching the L1 state yet or the threshold voltage distributions of the memory cells to be programmed to the L2 to L7 states instead. When the second programming pulse at the second programming loop is applied, these memory cells (including the memory cells not reaching the L1 state or having the L2~L7 target states) may be programmed simultaneously.

The issue accompanying the above programming scheme is that for those memory cells that failed the verification or have not yet been verified, it will continue applying the programming pulses to the memory cells such that they can be programmed to their respective target states. This programming scheme, however, may cause the read margin between two adjacent programming states to deteriorate.

In addition, with the use of this programming scheme, the memory cells to be programmed will have fast charge loss after reaching their respective target state, resulting in a wider threshold voltage distribution of the memory cells. That is, loss of the read margins of the memory cells can become large, thereby resulting in further deterioration of the read margin between adjacent two programming states.

It should be noted that the above description is given by using the TLC as examples, but it is not limited thereto. For example, when the QLC is programmed, the number of the programming states increases from 7 to 15. It can be understood that as the number of programming states further increases, the read margin of the programming states of the QLCs may become worse.

Figure 3:
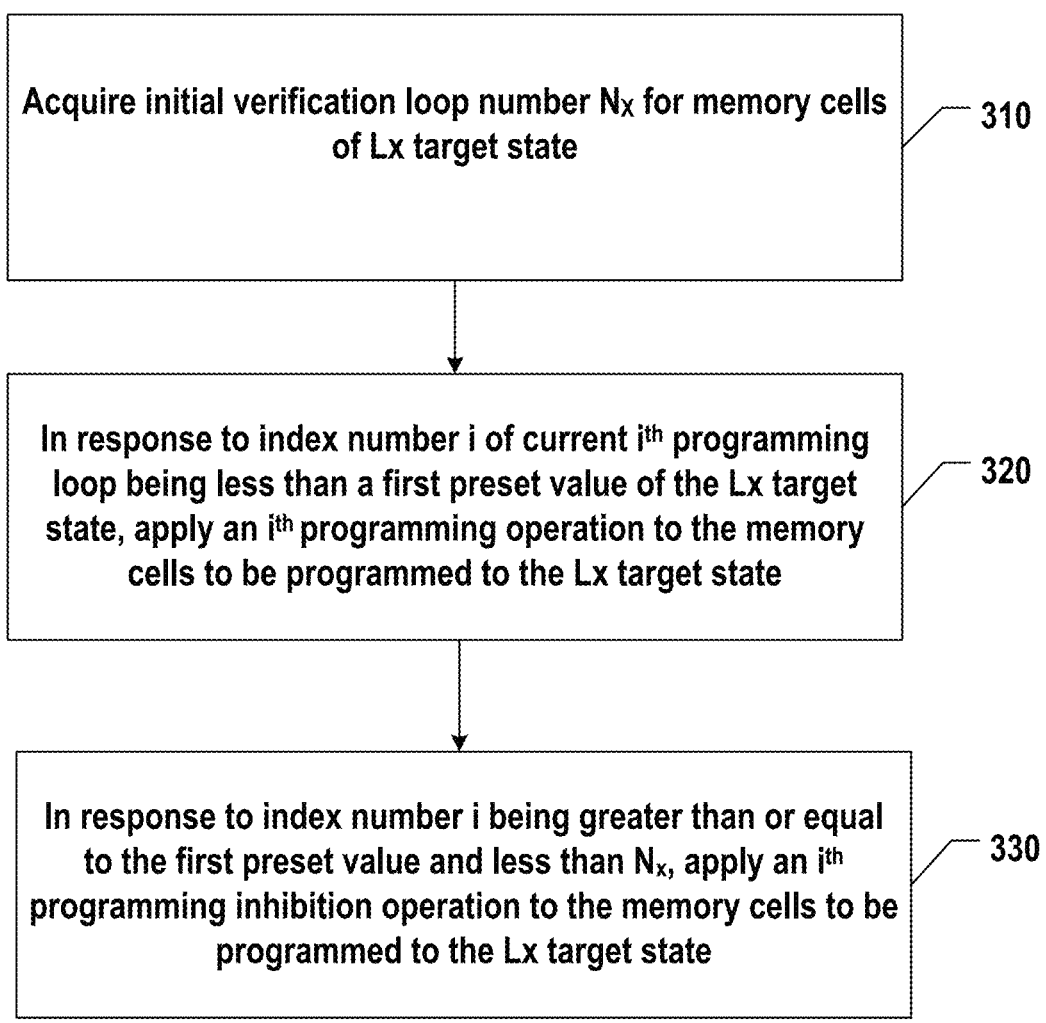
FIG. 3 illustrates a flow chart of the first exemplary program operation method, according to some implementations of the present disclosure.

To address the above-identified and other issues, the present disclosure provides various program operation methods. FIG. 3 illustrates a flow chart of the first exemplary program operation method 300 for a memory device, according to some implementations of the present disclosure. The memory device may be programmed to a target state including the first state to the Lx state.

At 310 in FIG. 3, an initial verification loop number $N_X$ of the memory cells of a Lx target state may be acquired, where x may be an integer greater than 1 (one) and less than or equal to L, and L may be an integer greater than 1 (one).

The value of L may correspond to the number of programming states for the memory cells. The memory device may include a memory array that has a plurality of memory cells. The memory cells may each include a single-level cell capable of storing one-bit data, a multi-level cell capable of storing two-bit data, a triple-level cell capable of storing three-bit data, and a quadruple-level cell capable of storing four-bit data. Taking the TLC for example, the highest programming state for the TLC is the seventh (L7) state. Therefore, L is 7 for the TLC. By contrast, in the QLC scenario, the highest programming state for the QLC is the fifteenth (L15) state. That is, L is 15 for the QLC.

At 310 in FIG. 3, the initial verification loop number $N_X$ for the memory cells to be programmed to the Lx target state may be acquired based on information stored in the data registers of the memory device. That is, Lx may be given by the memory system. It is apparent that the initial verification loop number $N_X$ for the memory cells of an Lx target state can be identical to or different from an initial verification loop number $N_{X+1}$ for memory cells to be programmed to an $L_{X+1}$ target state. In some implementations, the initial verification loop number $N_X$ for the memory cells to be programmed to the Lx target state may be smaller than the initial verification loop number $N_{X+1}$ for memory cells to be programmed to the $L_{X+1}$ target state, where x+1 may be an integer less than or equal to L (i.e., the number of programming states for the memory cells).

Using the TLC as examples with reference to TABLE 1 above, it can be seen that the initial verification loop number $N_2$ for starting a verification pulse corresponding to the L2 target state is 3; the initial verification loop number $N_3$ for starting a verification pulse corresponding to the L3 state is 5; the initial verification loop number $N_4$ for starting a verification pulse corresponding to the L4 state is 6, and the initial verification loop number $N_5$ for starting a verification pulse corresponding to the L5 state is 8; the initial verification loop number $N_6$ of starting a verification pulse corresponding to the L6 state is 10, and the initial verification loop number $N_7$ of starting a verification pulse corresponding to the L7 state is 13. These initial verification loop numbers herein are used only as examples, but the present disclosure does not limit thereto. The initial verification loop number of starting verification pulses for each target state may be determined according to the step sizes of the programmed pulses, to which the present disclosure also does not place limitations.

Method 300 may proceed to 320. At 320, in response to determining that an index i of a current $i^{th}$ programming loop is greater than or equal to 1 (one) and less than a first preset value corresponding to the Lx target state, an $i^{th}$ program operation may be performed on the memory cells to be programmed to the Lx target state. The index i may be a positive integer.

The above $i^{th}$ program operation may include turning on an upper selector (e.g., a selector transistor) of a selected memory string, shutting off a lower selector of the selected string, applying a bit-line programming voltage to a bit line coupled to the selected memory string, and applying a program voltage to a word line coupled to a memory cell to be programmed to the Lx target state. The selected memory string may include the memory cell to be programmed to the Lx target state.

Further, at 330, in response to determining that the index i is greater than or equal to the first preset value and less than the initial verification loop number N x, at the $i^{th}$ programming loop, an $i^{th}$ programming inhibition operation may be performed on the memory cells to be programmed to the Lx target state.

The above $i^{th}$ programming inhibition operation may include shutting off an upper selector (e.g., a selector transistor) of an unselected memory string, shutting off a lower selector of the unselected string, and applying a bit-line programming inhibition voltage (may be greater than the bit-line programming voltage) to a bit line coupled to the unselected memory string. The unselected memory string may include the memory cell to be programmed to the Lx target state.

At 320 and 330, it may be determined whether to perform the program operation or the programming inhibition operation on the memory cells to be programmed to the Lx target state, before the Lx target state is verified, based on a relationship of the index i, the first preset value of the Lx target state, and the initial verification loop number N.

In accordance with the scope of the present disclosure, the first preset value corresponding to the Lx state may be used to indicate a programming loop number that starts performing a programming inhibition operation on the memory cells to be programmed to the Lx target state before the verification operation is performed on the memory cells. It can be understood that the first preset value of the Lx target state may be identical to or different from the first preset value of the Lx-pi state. In some implementations, the first preset value can be identical for all the target states and may be equal to 2.

In some implementations, the initial verification loop number Nx may be acquired, and the program operation may be performed on the first portion of memory cells based on the relationship of the index i, the first preset value of the Lx target state, and the initial verification loop number N. Meanwhile, the programming inhibition operation may be performed on the second portion of memory cells simultaneously. That is, while continuing to program the first portion of memory cells, the programming of the second portion of memory cells may be inhibited. As such, the read margin between these two portions of memory cells can be increased.

Moreover, because the program operation is only performed on the first portion of memory cells, these memory cells will have slower charge loss after reaching the target state. Therefore, a narrower threshold voltage distribution of the memory cells can be obtained. As a result, the read margin of the memory cells can be increased, thereby resulting in fewer reading errors and enhancing the performance of the memory device.

Figure 4:
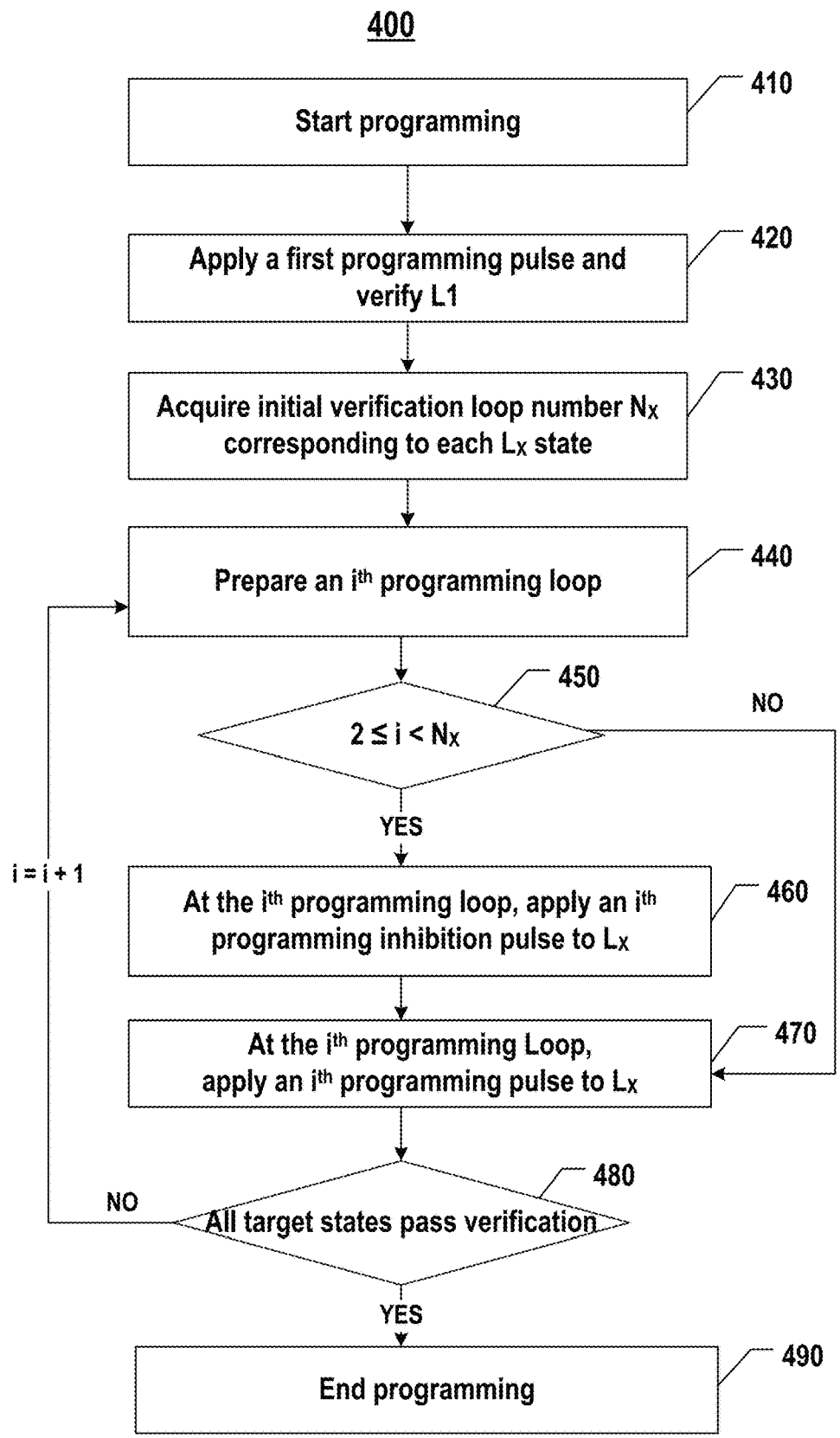
FIG. 4 illustrates a flow chart of the second exemplary program operation method, according to some implementations of the present disclosure.

FIG. 4 illustrates a flow chart of the second exemplary program operation method 400, according to some implementations of the present disclosure. In some examples, the first preset value may be a fixed integer, such as 2. In interpretation, when the first preset value is a fixed number, it may represent that programming loop numbers that start performing programming inhibition operations on the memory cells of all the target states before the verification operation is performed on the memory cells are identical. In these examples, at the second programming loop, the inhibition operations may be started and performed on the memory cells corresponding to all the target states.

Based on the TLC scenario, TABLE 2 below shows the program operations when the first preset value is 2 for all the target states according to method 400 in FIG. 4. With reference to FIG. 4 and TABLE 2, program operation method 400 may start at 410. At a first programming loop at 420, a first programming pulse may be applied. In some examples, the first programming pulse may be applied to word lines coupled to memory cells to be programmed to the L1 target state. These memory cells may be verified to determine whether they indeed reach the L1 state. In some examples, upon applying the first programming pulse, each of the memory cells to be programmed to the L1 target state may be verified with a first programming verification pulse to determine whether the L1 target state is reached.

In some implementations, at the first programming loop corresponding to 420, the first programming pulse may be applied to the memory cells to be programmed to the L1 target state and also to memory cells to be programmed to the L2~L7 target states. It can be understood that the signal strength of the first programming pulse may be relatively small, and thus the memory cells in the memory device may not be over-programmed due to the first programming pulse. This may also imply that even when the memory cells having the L2~L7 target states are programmed with the first programming pulse, their read margins may not be significantly influenced.

At 430, the initial verification loop number Nx corresponding to each Lx target state may be acquired, where x is equal to or greater than 2 and less than the number of programming states (e.g., 7 in the TLC case).

In TABLE 2 below, the initial verification loop number Nx corresponding to each Lx state is underlined and shown. For example, in the TLC scenario, when x=2, the initial verification loop number $N_2$ is 3; when x=3, the initial verification loop number $N_3$ is 5; when x=4, the initial verification loop number $N_4$ is 6; . . . , when x=7, the initial verification loop number $N_7$ is 13. It should be noted that the above description uses the TLC for example, but it is not limited thereto. In some examples, when the QLC is programmed, the number of the programming states may increase from 7 to 15.

Method 400 may proceed to 440, where an $i^{th}$ programming loop may be prepared, where i is an integer greater than 2. That is, 440 may start at the second programming loop for each target state.

At 450, the value of the index i may be checked to determine whether it is greater than and equal to 2 and less than the initial verification loop number Nx, where 2 corresponds to the first preset value. In other words, the index i may be checked to determine whether it falls within a range between 2 to $N_x-1$. The range may include the first preset value (in FIG. 4, it being "2") as a lower bound and the initial verification loop number $N_x$ minus 1 as an upper bound. Another way to interpret determination block 450 is that the range between 2 and $N_x-1$ may be checked with the programming loop index i. In the broader interpretation, for a target state, loop numbers within the range may represent the programming loop numbers in which the programming inhibition pulses may be applied.

When it is determined that the index i is greater than or equal to the first preset value and less than the initial verification loop number $N_x$ (i.e., within the range 2 and $N_x-1$), method 400 may proceed to 460, where an $i^{th}$ programming inhibition pulse may be applied to the memory cells of the Lx target state at the $i^{th}$ programming loop (shown as forward slashes in TABLE 2). On the other hand, when it is determined that the index i does not satisfy the condition (not within the range), method 400 may proceed to 470 instead. At 470, the $i^{th}$ programming pulse may be applied to the memory cells of the Lx target state. Upon the $i^{th}$ programming pulse, a verification pulse may be applied.

For example, when the first preset value is 2, at the third programming loop, the index i is 3. Further, for the L2 target state where x=2, the initial verification loop number $N_2$ corresponds to 3. As a result, the index of 3 does not satisfy the condition of being less than 3 ($N_2=3$) at 450. Hence, at this stage, for the L2 target state, method 400 may proceed to 470, and a third programming pulse may be applied to the memory cells of the L2 target state. Instead, for the L3 target state where x=3, the initial verification loop number $N_3$ is equal to 5. Therefore, the index of 3 corresponding to the L3 target state satisfies the condition (≥2 and ≤5). By contrast, at this stage for the L3 target state, method 400 may proceed to 460 where a third programming inhibition pulse may be applied to the memory cells of the L3 target state. For preparing other programming loops in the other target states, the same/similar techniques may be applied.

It can be understood that the initial verification loop number $N_x$ may vary for each Lx target state. Hence, a portion of FIG. 4 may be understood in a manner that there includes an inner loop for each target state (repeating from 450 to 470) for determining whether a programming inhibition pulse or a programming pulse may be applied for each Lx state at the $i^{th}$ programming loop.

TABLE 2

| | (First preset value = 2) | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| L1 | V | V | V | V | V | | | | | | | | | | | |
| L2 | | | <u>V</u> | V | V | V | V | | | | | | | | | |
| L3 | | | | | <u>V</u> | V | V | V | | | | | | | | |
| L4 | | | | | | <u>V</u> | V | V | V | V | | | | | | |
| L5 | | | | | | | | <u>V</u> | V | V | V | | | | | |
| L6 | | | | | | | | | | <u>V</u> | V | V | V | V | | |
| L7 | | | | | | | | | | | | | <u>V</u> | V | V | V |

At 480, it may be determined whether all the target states pass the verification. When all the target states have passed the verification, the program operations may end at 490. Otherwise, method 400 may return to 440 and proceed to prepare the next programming loop, which is an $(i+1)^{th}$ programming loop.

At a result corresponding to TABLE 2 above, when the initial verification loop number $N_2$ for the L2 target state is 3 and the first preset value is 2, at the second programming loop, the programming inhibition pulse may be applied to the memory cells to be programmed to the L2 target state.

As another example, when the initial verification loop number $N_3$ for the L3 target state is 5, from the second programming loop to the fourth programming loop, the programming inhibition pulses may be applied to the memory cells to be programmed to the L3 target state. For example, at the fourth programming loop, the fourth programming inhibition pulse may be applied to a portion of these memory cells.

As still another example, when the initial verification loop number $N_7$ for the L7 target state is 13, from the second programming loop to the twelfth programming loop, the programming inhibition pulses may be applied to the memory cells to be programmed to the L7 target state. For example, at the twelfth programming loop, the twelfth programming inhibition pulse may be applied to a portion of these memory cells.

As illustrated in FIG. 2B with reference to TABLE 2 above, the solid curve, on the right side corresponding to the L1 state, represents, after the first programming loop, the threshold voltage distribution of the memory cells having the L1 target state and having reached the L1 state. When the second programming loop is performed, the programming inhibition pulse can be applied to these memory cells as well as the memory cells having the L2 to L7 target states. On the other hand, the dotted curve corresponding to the L1 state depicts the threshold voltage distribution of the memory cells having the L1 target state but not reaching the L1 state yet. When the second programming loop is performed, these memory cells that do not reach the L1 state may be programmed.

It can be understood that, at the second programming loop, the memory cells having the L1 target state but not reaching the L1 state may be programmed, while the programming inhibition pulses may be applied to the memory cells to be programmed to the L2 to L7 target states. As such, the program operations on the memory cells having the L2 to L7 target states can be avoided. Consequently, the width of the threshold voltage distribution of the memory cells having the L1 target state may decrease, thereby further increasing the read margin between the L1 and L2 states.

Further, through only programming the memory cells having the L1 target state but not reaching the L1 state, after these memory cells arrive at the L1 state, charge loss may be small. Besides, as described above, the threshold voltage distribution of the memory cells of the L1 state may become narrower, which may be beneficial to increasing the read margin between the L0 and L1 states and the read margin between the L1 and L2 states.

As illustrated in FIG. 2C with reference to TABLE 2 above, the solid curves on the right side corresponding to the L1 and L2 states represent, after the sixth programming loop, the threshold voltage distribution of the memory cells having the L1 target state and having reached the L1 state, and the threshold voltage distribution of the memory cells having the L2 target state and having reached the L2 state, respectively. When the seventh programming loop is performed, the programming inhibition pulses can be applied to these memory cells and also to the memory cells having the L5 to L7 target states. In FIG. 2C, on the other hand, the dotted curves on the right side show the threshold voltage distribution of the memory cells having the L2 target state but not reaching the L2 state yet, and the threshold voltage distributions of the memory cells having the L3 and L4 target states. When the seventh programming loop is performed, these memory cells that do not reach the L2 state and the memory cells to be programmed to the L3 and L4 states may be programmed.

It can be understood that at the seventh programming loop, the memory cells having the L2 target state but not reaching the L2 state may be programmed, while the programming inhibition pulses may be applied to the memory cells to be programmed to the L5 to L7 states. As such, the program operations on the memory cells having the L5 to L7 target states can be avoided. Consequently, the width of the threshold voltage distribution of the memory cells having the L2 target state may become narrower, thereby further increasing the read margins between the L1 and L2 states and between the L2 and L3 states.

In FIGS. 2A-2C, the solid curves below the reference element L0 represent the voltage distributions of the memory cells of the L1 to L7 target states under the erased state L0. In other words, the memory cells may be programmed to assume one of the programming states of L1 to L7 from the erased state L0.

As described, the first preset value may be used to indicate the number of an initial programming loop that starts a programming inhibition operation performed on the memory cells to be programmed to the Lx target state, before the initial verification operation is performed on the memory cells. In FIG. 4, the first preset value for each target state is set to be a fixed number (i.e., 2). In other words, for each target state, starting at the second programming loop, the programming inhibition pulses may be applied to the memory cells. As such, the number of memory cells being programmed each time may be reduced. Consequently, the threshold voltage of the memory cells for each target state may become narrower, further increasing the read margins of each target state.

Figure 5:
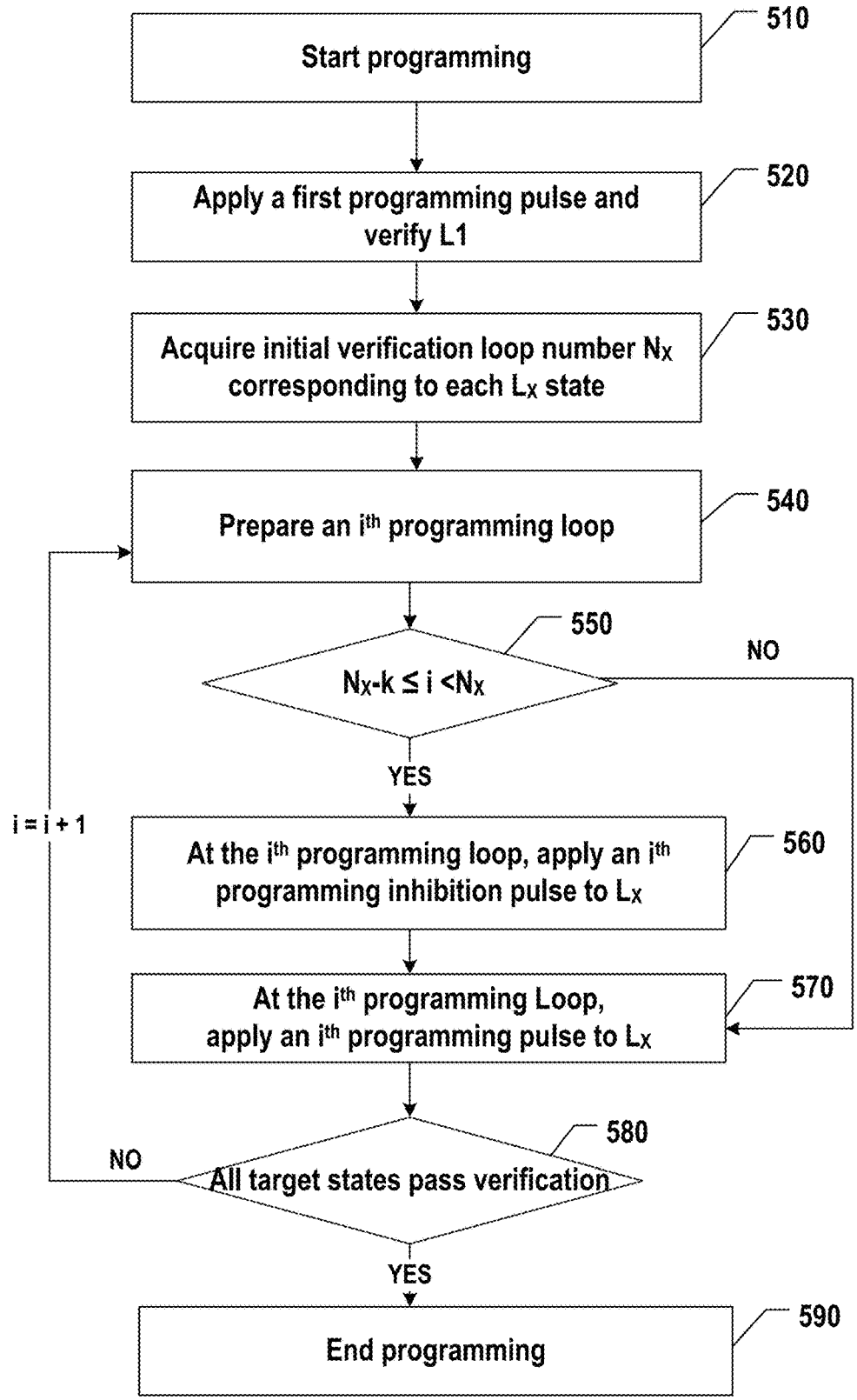
FIG. 5 illustrates a flow chart of the third exemplary program operation method, according to some implementations of the present disclosure.

FIG. 5 illustrates a flow chart of the third exemplary program operation method 500, according to some implementations of the present disclosure. Method 500 in FIG. 5 may be based on method 400 in FIG. 4. In FIG. 4, the first preset value may be a fixed number for each target state, e.g., the value of 2. By contrast, in other implementations, the first preset value corresponding to each target state may be different. In other words, for each target state before the verification operation is performed on the memory cells, the programming loop numbers that start performing programming inhibition operations on the memory cells may be different. In some implementations, block 450 in FIG. 4 may be replaced by block 550, where the first preset value "2" at determination block 450 of FIG. 4 may be changed to a difference between the initial verification loop number $N_X$ and a second preset value k (i.e., $N_X-k$). That is, the first preset value may be modified as $N_X-k$ that may include a variable x and thus depend on a corresponding target state.

At 550 in FIG. 5, the index i of the $i^{th}$ programming loop may be checked to determine whether it is greater than or equal to $N_X-k$ and less than the initial verification loop number N. Parameter k may include a positive integer. In some implementations, at block 530, after obtaining the initial verification loop number $N_X$, the value of $N_X-k$ may be determined as the first preset value at this stage as well. In some implementations, except for the difference between 450 in FIGS. 4 and 550 in FIG. 5, the other parts of method 400 and method 500 (including 510, 520, 540, 560, 570, 580, and 590) may be identical or similar. Thus, details of the blocks in FIG. may refer to the descriptions about FIG. 4.

In boarder interpretation, the range corresponding to 550 may include the lower bound of the difference between the initial verification loop number $N_X$ and the second preset value k (i.e., $N_X$-k), and the upper bound may remain the same as the initial verification loop number $N_X$ minus 1 (i.e., $N_X$-1). The range between $N_X$-k and $N_X$-1 may be checked with the programming loop index i. In the broader interpretation, for a target state, numbers within this range may represent the programming loop numbers in which the programming inhibition pulses may be applied.

In some implementations, the value of the second preset value k may be 4. It can be understood that k can be any other positive integer. In one example, as obtained above, the initial verification loop number $N_2$ corresponding to the L2 target state is 3. Therefore, the difference between the initial verification loop number $N_X$ and the second preset value k may become 3-4=-1. That is, the range may be established between -1 (3-4=-1) and 2 ($N_2$-1=3-1=2). Considering that the index i is an integer greater than 2, however, the lower bound of the range may be modified to 2 correspondingly. In other words, at the second programming loop, a programming inhibition pulse may be applied to the memory cells of the L2 target state.

Based on the TLC scenario, TABLE 3 below shows the program operations with the second preset value k=4 for all the target states, according to method 500 in FIG. 5.

TABLE 3

| | (k = 4) | | | | | | | | | | | | | | | |
|---|---|---|---|---|---|---|---|---|---|---|---|---|---|---|---|---|
| Loop | 1 | 2 | 3 | 4 | 5 | 6 | 7 | 8 | 9 | 10 | 11 | 12 | 13 | 14 | 15 | 16 |
| L1 | V | V | V | V | V | | | | | | | | | | | |
| L2 | | V̲ | V | V | V | V | | | | | | | | | | |
| L3 | | | V̲ | V | V | V | | | | | | | | | | |
| L4 | | | | V̲ | V | V | V | V | | | | | | | | |
| L5 | | | | | V̲ | V | V | V | | | | | | | | |
| L6 | | | | | | V̲ | V | V | V | V | | | | | | |
| L7 | | | | | | | V̲ | V | V | V | | | | | | |

As a result (shown in TABLE 3), for the memory cells of the L5 target state, the initial verification loop number $N_5$ is 8. When the second preset value k=4, the range may be between 4 (8-4=4) and 7 (8-1=7). In other words, from the fourth to seventh programming loops, programming inhibition pulses may be applied to the memory cells of the L5 target state. In some examples, the second program operation (performed at the second programming loop) and the third program operation (performed at the third programming loop) may be performed on the memory cells of the L5 target state.

In some implementations, at the first programming loop, the first programming pulse may be applied to the memory cells to be programmed to the L1 target state and also to memory cells to be programmed to the L2~L7 target states. As described, the signal strength of the first programming pulse may be relatively small, and thus the memory device may not be over-programmed due to the first programming pulse. This may imply that when the memory cells having the L2~L7 target states are programmed with the first programming pulse, the read margins may not be significantly impacted.

In some examples, the second preset value k may be an integer no less than 1 and no greater than 5. In other words, the second preset value k may be an integer selected from 1, 2, 3, 4, and 5. The selection of the second preset value k may depend on a practical application in view of, e.g., the read margin requirements and the performance of the memory device, to which the present disclosure does not place limitations.

In this program operation scheme, the values of the first preset value corresponding to each target state are different. After obtaining the initial verification loop number Nx of each target state, the difference between the initial verification loop number of each target state (Nx) and the index i may be calculated. In a portion of this scheme, when the difference is greater than the second preset value k, the program operation may be performed on the memory cells of the target state. On the other hand, when the difference is less than or equal to the second preset value k, the programming inhibition pulses may be applied to these memory cells.

Through this manner, the first preset value for each target state may be determined according to the initial verification loop number of each target state (Nx) and the second preset value (i.e., k), thus improving the flexibility of the program operations.

Moreover, for the same target state (e.g., the Lx target state) of the memory cells, when the index i of the current programming loop is greater than or equal to 1 and less than the first preset value of the Lx target state (i.e., Nx-k in this method), the program operation may be performed on the memory cells of the Lx target state, while when the index i is greater than or equal to the first preset value, no program operation may be performed. Consequently, while reducing the programming interference, some of the memory cells may be programmed in advance, thereby improving the programming efficiency.

As described with reference to FIG. 5, the first preset value may be a variable. Moreover, in some implementations, the first preset value may be a variable depending on an initial verification loop number of a target state lower than the Lx state. More specifically, an initial programming loop number that starts applying a programming inhibition pulse may be determined by an initial verification loop number $N_{x-j}$ corresponding to a Lx-j target state, where x may denote a target state index and may be greater than or equal to 2 and less than the number of all the target states of the memory cells, and j denotes a third preset value. The third preset value j may be a positive integer to make the value of (x-j) greater than 1 (one). That is, starting at an $(x-j)^{th}$ programming loop, a programming inhibition pulse may be applied to the memory cells of the Lx target state. As such, the number of memory cells being programmed each time may be reduced. Consequently, the threshold voltage distribution of the memory cells for each target state may become even narrower, further increasing the read margins of each target state.

Figure 6:
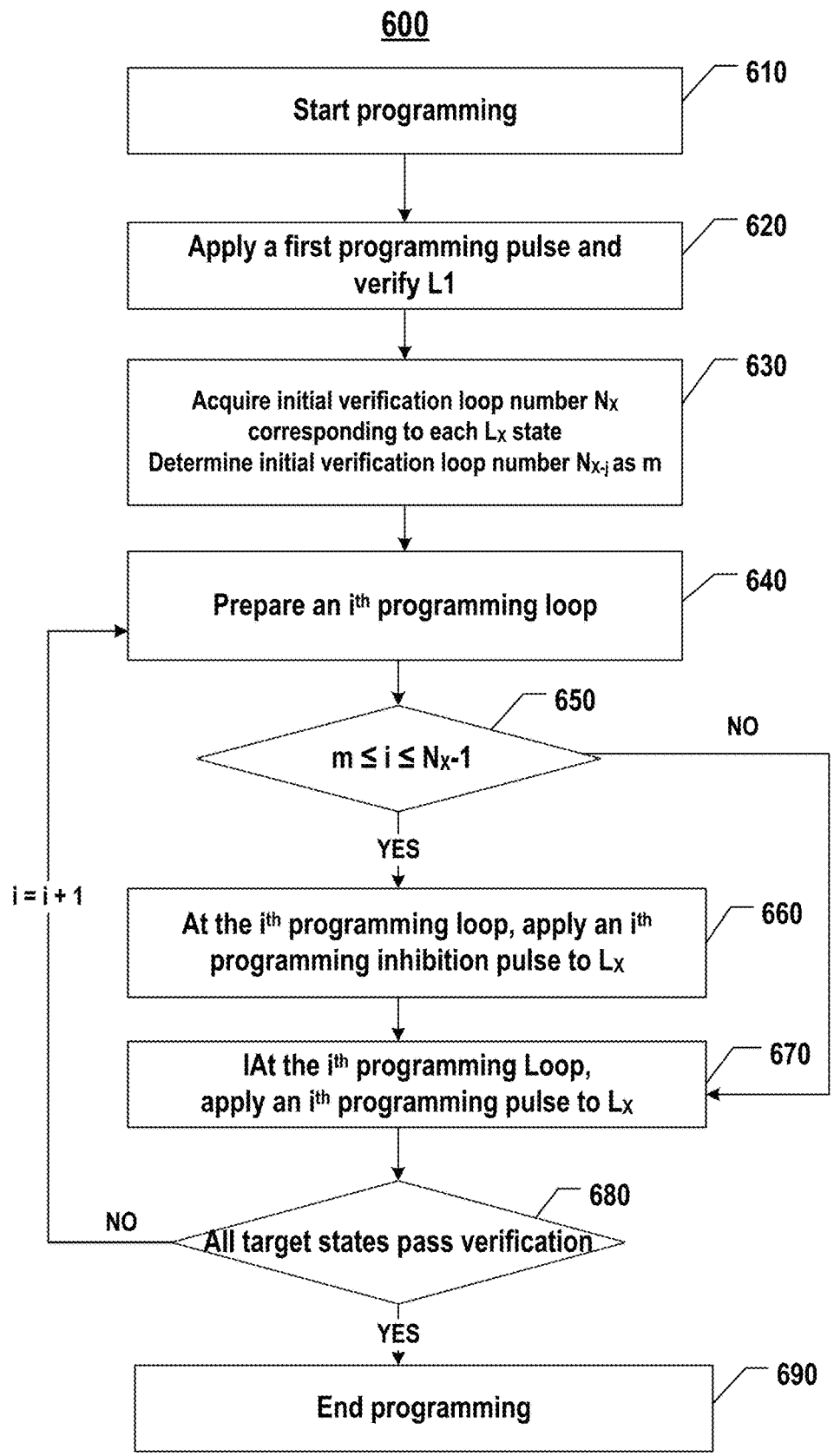
FIG. 6 illustrates a flow chart of the fourth exemplary program operation method, according to some implementations of the present disclosure.

FIG. 6 illustrates a flow chart of the fourth exemplary program operation method 600, according to some implementations of the present disclosure. Method 600 in FIG. 6 may be based on method 400 in FIG. 4. In method 600, the first preset value as modified (i.e., the modified lower bound of the range) corresponding to each target state may be determined by the initial verification loop number $N_{x-j}$ of the Lx−j target state. Accordingly, block 450 in FIG. 4 may be replaced by block 650, where the first preset value "2" of the lower bound at 450 in FIG. 4 may be changed to the initial verification loop number $N_{x-j}$ of the Lx−j target state, denoted as a parameter m. That is, parameter m can be viewed as the modified first preset value. In another interpretation, the range may include the lower bound of m, and the upper bound may remain the same as the initial verification loop number $N_X$ being minus 1.

In order to acquire the value of m (the first preset value as modified, i.e., the initial verification loop number $N_{x-j}$ of the Lx−j target state), at 630 in FIG. 6, the initial verification loop number $N_{x-j}$ of the Lx−j target state may be determined as m. In some implementations, except for the difference between block 450 in FIG. 4 and block 650 in FIG. 6 and block 430 in FIG. 4 and block 630 in FIG. 6, other portions of method 400 in FIG. 4 and method 600 in FIG. 6 (including 610, 620, 640, 660, 670, 680, and 690) may be identical or similar.

In some implementations, the value of the third preset value j may be 2. It can be understood that the third preset value j can be any other positive integer such that the value of (x−j) be greater than 1 (one). In some implementations, the value of the third preset value j can be determined according to the number of the target states of a memory device. For example, in the TLC scenario, the number of the target states is 7 (i.e., L=7). Correspondingly, the value of the third preset value j can be an integer selected from 1, 2, . . . , 5. On the other hand, in the QLC scenario, the number of the target states is 15 (i.e., L=15), and the value of the third preset value j can be an integer selected between 1 to 10. The selection of the third preset value j may depend on the read margin requirements and the performance of the memory device. The present disclosure does not limit thereto.

As obtained above, the initial verification loop number $N_4$ corresponding to the L4 target state is 6. When j=2, the modified first preset value m may include the initial verification loop number $N_{4-2}=N_2=3$. That is, the lower bound of the range is 3, while the upper bound may remain to be the initial verification loop number $N_4$ being minus 1 (i.e., 5). That implies, from the third programming loop to the fifth programming loop, programming inhibition pulses may be applied to the memory cells of the L4 target state.

Based on the TLC scenario, TABLE 4 below shows program operations with the third preset value j=2, according to method 600 in FIG. 6.

In other words, from the sixth to ninth programming loops, programming inhibition pulses (shown as forward slashes corresponding to the L6 state in TABLE 4) may be applied to the memory cells of the L6 target state. In some examples, the second program operation, the third program operation, the fourth program operation, and the fifth program operation may be performed on the memory cells of the L6 state at respective programming loops.

In some implementations, at the first programming loop, the first programming pulse may be applied to the memory cells to be programmed to the L1 target state and also to memory cells to be programmed to the L2~L7 target states. As described, the signal strength of the first programming pulse may be relatively small, and thus the memory device may not be over-programmed due to the first programming pulse. This may imply that even when the memory cells having the L2~L7 target states are programmed with the first programming pulse, the read margins may not be significantly influenced.

In some examples, the third preset value j may be a positive integer that satisfies (x−j)>1. The selection of the third preset value j may depend on a real application, considering the read margin requirement and the performance of the memory device, to which the present disclosure does not place limitations.

In some implementations of the present disclosure, the value of the first preset value corresponding to each target state may be different and may be a variable depending on the initial verification loop number of a lower target state. After obtaining the initial verification loop number Nx of each target state, the initial verification loop number Nx−j of the lower Lx−j target state may be acquired and determined as the first preset value as the modified first preset value m (or the modified lower bound of the range). When the current programming loop index i is less than the first preset value m, the program operations may be performed on the memory cells of the current target state. On the other hand, when the current programming loop index i is greater than or equal to the first preset value m, the programming inhibition pulses may be applied to the memory cells.

Through this manner, the first preset value m for each target state may be determined according to the initial verification loop number of each target state ($N_x$) and the third preset value j, thus bringing flexibility to the program operation methods. Further, while reducing programming interference, these memory cells may be programmed in advance, thereby improving programming efficiency.

TABLE 4

| | (j = 2) | | | | | | | | | | | | | | | |
|---|---|---|---|---|---|---|---|---|---|---|---|---|---|---|---|---|
| Loop | 1 | 2 | 3 | 4 | 5 | 6 | 7 | 8 | 9 | 10 | 11 | 12 | 13 | 14 | 15 | 16 |
| L1 | V | V | V | V | V | | | | | | | | | | | |
| L2 | | | <u>V</u> | V | V | V | V | | | | | | | | | |
| L3 | | | | <u>V</u> | V | V | V | V | | | | | | | | |
| L4 | | | | | <u>V</u> | V | V | V | V | | | | | | | |
| L5 | | | | | | | <u>V</u> | V | V | V | V | | | | | |
| L6 | | | | | | | | | <u>V</u> | V | V | V | V | | | |
| L7 | | | | | | | | | | | | <u>V</u> | V | V | V | |

As shown in TABLE 4, for the memory cells of the L6 target state, the initial verification loop number $N_6$ is 10. When the third preset value j=2, the initial verification loop number $N_{6-2}$ may be determined as 6 as the modified first preset value m. That is, the range may be between 6 and 9.

In some implementations, the value of the third preset value j may be 3. It can be understood that the third preset value j can be any other positive integer such that (x−j)>1. As obtained earlier, the initial verification loop number $N_5$ corresponding to the L5 target state is 8. When j=3, the first preset value as modified m may include the initial verification loop number $N_{5\_3}=N_2=3$. That is, the modified lower bound of the range is 3, while the upper bound may remain to be the initial verification loop number $N_4$ being minus 1, which is 7. That implies, from the third programming loop to the seventh programming loop, programming inhibition pulses may be applied to the memory cells of the L5 state.

Based on the TLC scenario, TABLE 5 below shows program operations with the third preset value j=3, according to method 600 in FIG. 6.

TABLE 5

| Loop | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| | | | | | (j = 3) | | | | | | | | | | | |
| L1 | V | V | V | V | V | | | | | | | | | | | |
| L2 | | | <u>V</u> | V | V | V | V | | | | | | | | | |
| L3 | | | | | <u>V</u> | V | V | V | | | | | | | | |
| L4 | | | | | | V | V | V | V | V | | | | | | |
| L5 | | | | | | | <u>V</u> | V | V | V | V | | | | | |
| L6 | | | | | | | | | V | V | V | V | V | | | |
| L7 | | | | | | | | | | | | <u>V</u> | V | V | V | |

As shown in TABLE 5, for the memory cells of the L7 state, the initial verification loop number $N_7$ is 13. When the third preset value j=3, the initial verification loop number $N_{7\_3}$ may be determined as 6 as the modified first preset value m. That is, the range may be between 6 and 12. In other words, at the sixth to twelfth programming loops, programming inhibition pulses may be applied to the memory cells of the L7 state. In some examples, the second, third, fourth, and fifth program operations may be performed on the memory cells of the L7 state.

In some implementations, at the first programming loop, the first programming pulse may be applied to the memory cells to be programmed to the L1 state as well as memory cells to be programmed to the L2~L7 target states. As described, the signal strength of the first programming pulse may be relatively small, and thus the memory device may not be over-programmed due to the first programming pulse. This may also imply that even when the memory cells having the L2~L7 target states are programmed with the first programming pulse, the read margins may not be significantly influenced.

It is apparent that in accordance with the scope of the present disclosure, by obtaining the initial verification loop number of a lower target state, the initial verification loop number of the lower target state may be used as the modified first preset value. When the verification operation is performed on the memory cells of a lower target state, the programming inhibition operation may be performed on the memory cells of a higher target state. As such, the program operations may be performed on the memory cells of the lower target state and the higher target state, respectively. Consequently, the threshold voltage distribution of each target state may become narrower, thereby increasing the read margin of each target state.

In some implementations, when the current programming loop index i is greater than or equal to the initial verification loop number $N_x$, the $i^{th}$ program operation may be performed on the memory cells of the Lx target state. For example, starting at the sixth programming loop, the program operations may be performed on the memory cells of the L4 target state. After performing the $i^{th}$ program operation, an $i^{th}$ verification operation may be performed on these memory cells to obtain an $i^{th}$ verification result. When the $i^{th}$ verification result indicates that the program operation passes, the program inhibition operation may be performed on the memory cells of the Lx target state that passed the program operation (e.g., a backslash at the ninth programming loop for the L3 state in TABLE 5).

On the other hand, in response to determining that the $i^{th}$ verification result indicates that the program operation does not pass, the $(i+1)^{th}$ program operation may be performed on the memory cells of the Lx target state at the $(i+1)^{th}$ programming loop.

It can be understood that, based on the $i^{th}$ verification result, it can be determined whether the $(i+1)^{th}$ programmatic inhibition operation or the $(i+1)^{th}$ program operation may be performed on the memory cells of the Lx target state. It can also be understood that when the $i^{th}$ verification result indicates that the program operation has passed, it may also imply that these memory cells have reached the Lx target state upon the $i^{th}$ program operation.

In some implementations, when the $i^{th}$ verification result indicates that the program operation on the memory cells of the Lx target state has passed, at the $(i+1)^{th}$ programming loop, the $(i+1)^{th}$ programming inhibition operation may be performed on these memory cells to avoid over-programming. On the other hand, when the $i^{th}$ verification result indicates that the program operation on the memory cells having the Lx target state does not pass, it may be required that the program operation on these memory cells continues. In other words, the $(i+1)^{th}$ program operation may be performed on these memory cells to enable them to arrive at the Lx target state.

The $i^{th}$ verification result may be configured to indicate a result of the programming to the memory cells to be programmed after the $i^{th}$ program operation is performed. The $i^{th}$ verification result may include at least one of: first indication information indicating whether each memory cell has passed a verification operation; second indication information indicating whether each memory cell has failed the verification operation; or third indication information indicating the number of the memory cells that have reached their corresponding target states.

In some implementations, for example, the first indication information may include a binary value for indicating whether each memory cell has passed the verification operation. In some examples, the value of "0" may be used as the first indication information and show that the program operation passed, while the value of "1" may indicate the program operation failed. In other implementations, those skilled in the art may choose a suitable manner according to an application situation to represent the verification results. The present disclosure does not limit thereto.

In some implementations, the $i^{th}$ program operation performed on the memory cells of the Lx target state may include several sub-steps. For example, an $i^{th}$ bit-line programming voltage may be applied to bit lines coupled to the memory cells having the Lx target state. The $i^{th}$ bit-line programming voltage applied to the bit lines may be configured for programming the memory cells that do not pass the verification operation.

In some implementations, the $(i+1)^{th}$ programming inhibition operation, performed on the memory cells that passed the verification indicated by an $i^{th}$ verification result, may include several sub-steps. For example, an $(i+1)^{th}$ bit-line programming inhibition voltage may be applied to bit lines coupled to the memory cells that reached the Lx target state and passed the verification. The $(i+1)^{th}$ bit-line programming inhibition voltage applied to the bit lines may be configured to prevent over-programming to the memory cells that already passed the verification. In some instances, the $(i+1)^{th}$ bit-line programming inhibition voltage may be higher than the $i^{th}$ bit-line programming voltage.

In some implementations, the $(i+1)^{th}$ program operation performed on the memory cells having the Lx target state but not reaching it may include several sub-steps. For example, an $(i+1)^{th}$ bit-line programming voltage may be applied to bit lines coupled to the memory cells that do not pass the verification. In some instances, the $(i+1)^{th}$ bit-line programming voltage may be higher than the $i^{th}$ bit-line programming voltage, and the $(i+1)^{th}$ bit-line programming voltage may be lower than the $(i+1)^{th}$ bit-line programming inhibition voltage.

When the current programming loop index i is equal to 5 (i.e., equal to the initial verification loop number $N_3$=5), a fifth bit-line programming voltage may be applied to bit lines coupled to the memory cells of the L3 target state. When the fifth verification result indicates that these memory cells do not pass the verification operation, a sixth bit-line programming voltage may be applied to the bit lines coupled to these memory cells. In some examples, the sixth bit-line programming voltage may be higher than the fifth bit-line programming voltage. TABLE 6 below shows an example of various bit-line voltages applied to the memory cells of the L3 target state corresponding to TABLE 3. In the example shown in TABLE 6, the fifth bit-line programming voltage may be a ground-level voltage (such as 0V, underlined), and the sixth bit-line programming voltage may be a voltage level greater than 0 and less than Vdd. Vdd may be a bit-line programming inhibition voltage and can be a high-level applied to the bit lines coupled to the memory cells that have reached the L3 target state.

soft program operation may be performed on the memory cells of the target state. Accordingly, different voltage levels may be applied to bit lines coupled to the memory cells to be programmed to the target state. In some examples, a voltage level applied to the bit lines may be determined according to a previous verification result.

In some implementations, when the verification result indicates that a required threshold voltage of the target state is substantially close, a voltage higher than 0 and lower than Vdd may be applied to the bit lines coupled to the memory cells of the target state, such that the soft program operation may be performed on the memory cells. On the other hand, when the verification result indicates that a current voltage is far from the required threshold voltage, a voltage of 0 may be applied to the bit lines coupled to the memory cells, such that the program operation may be performed on the memory cells. Through this manner, the width of the threshold voltage distribution may be decreased, which may be beneficial to the read margins of each target state.

In one example, with reference to TABLE 3, at the second programming loop, a second bit-line programming voltage may be applied to bit lines coupled to the memory cells of the L1, L5, L6, and L7 target states, respectively. In some examples, the second bit-line programming voltage may be 0V. Meanwhile, a second bit-line programming inhibition voltage Vdd may be applied to bit lines coupled to the memory cells of L2 to L4 target states. For example, the voltage level of Vdd may be higher than 0V.

Figure 7:
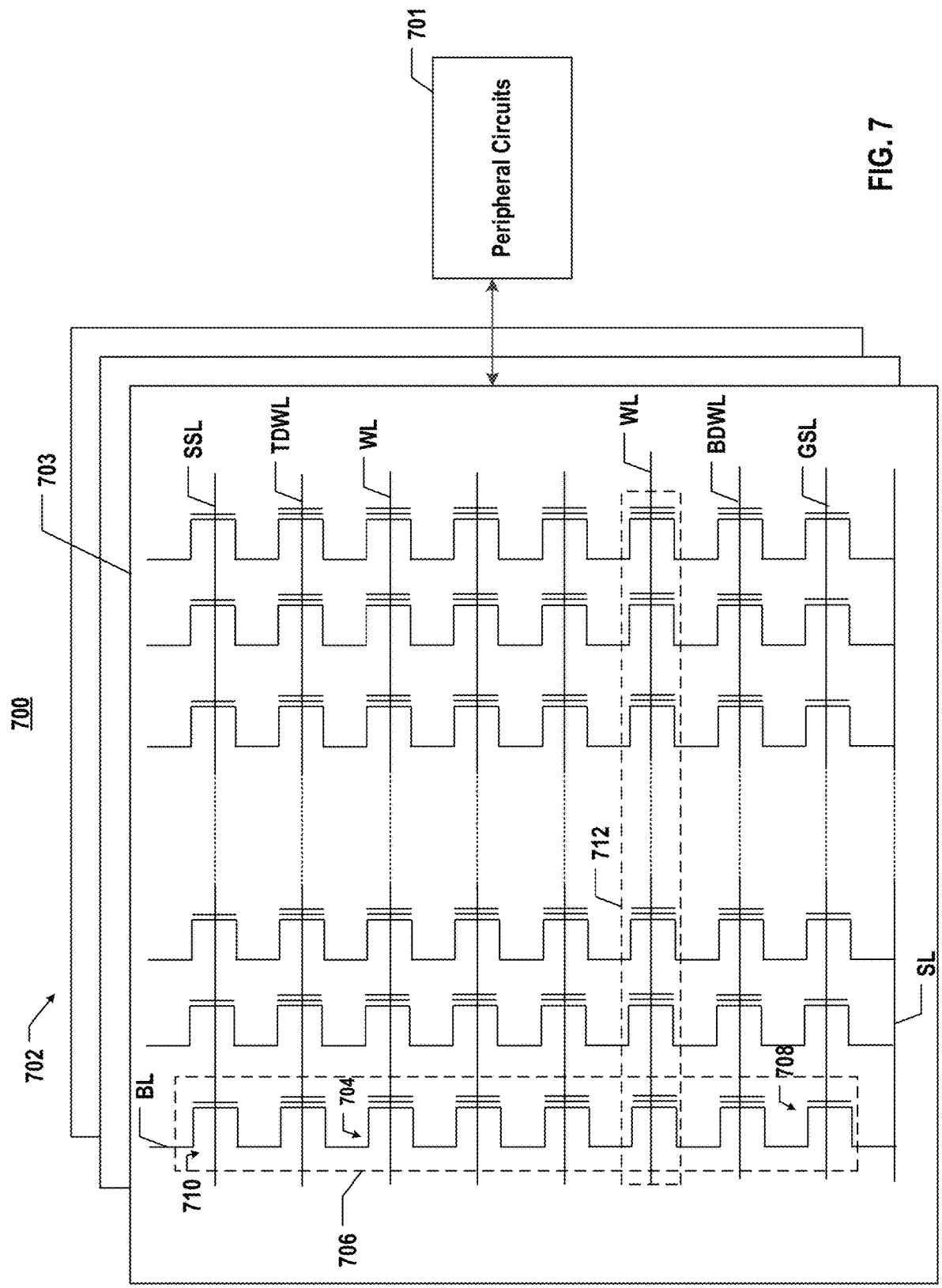
FIG. 7 illustrates a schematic diagram of an exemplary memory device including peripheral circuits and a memory cell array, according to some implementations of the present disclosure.

FIG. 7 illustrates a schematic diagram of an exemplary memory device 700 including peripheral circuits 701 and a memory cell array 702, according to some implementations of the present disclosure. Memory cell array 702 may include one or more blocks 703, such as block 0, block 1, block 2, block 3, . . . , etc. Each block may include a plurality of word lines WLs, bit lines BLs, and memory cells 704 formed between word lines WLs and bit lines BLs, as shown in FIG. 7. In some instances, the word lines WLs may include one or more main word lines WLs, one or more top dummy word lines TDWLs, and one or more bottom dummy word lines BDWLs, as shown in FIG. 7. In other instances, the word lines WLs may further include one or more intermediate dummy word lines between the main word lines. In some implementations, memory cell array 702 can include a three-dimensional (3D) NAND memory cell array.

The 3D NAND memory cell array may include a semiconductor substrate, a memory stack that may include inter-

TABLE 6

| Bit-line Voltage | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| L3 | 0 | Vdd | Vdd | Vdd | <u>0</u> | 0~Vdd | 0~Vdd | 0~Vdd | Vdd | Vdd | Vdd | Vdd | Vdd | Vdd | Vdd | Vdd |

With reference to TABLE 6, when an eighth verification result indicates that the memory cells of the L3 target state have passed the verification operation. In the ninth programming loop, while performing program operations on memory cells of higher target states, a bit-line programming inhibition voltage may be applied to bit lines coupled to these memory cells to avoid over-programming. In one example, the ninth bit-line programming inhibition voltage may include a high-level voltage, such as Vdd shown in TABLE 6.

It can be understood that, in some implementations of the present disclosure, after reaching the initial verification loop number $N_X$ of the Lx target state, a program operation or a leaved gate conductive layers and gate-to-gate dielectric layers above the semiconductor substrate, and a plurality of channel holes (CH), each extending vertically through the memory stack. A memory film may be formed along a sidewall of the channel hole. The memory film may include a barrier layer, a tunneling layer, a storage layer, a blocking layer, etc. Each memory cell 704 may be formed in an intersection between the memory film and each gate layer.

As shown in FIG. 7, in some implementations, memory cell array 702 in one block 703 may be provided in the form of an array of memory strings 706, such as NAND memory strings. In some implementations, each of memory strings 706 may extend vertically above a substrate (such as 802 shown in FIG. 8), and each may include a plurality of memory cells 704 coupled in series and stacked vertically. Each memory cell 704 may retain a continuous, analog value, such as an electrical voltage or an electronic charge, which depends on the number of electrons trapped within a region of memory cell 704. Each memory cell 704 can be either a floating type of memory cell having a floating-gate transistor or a charge-trap type of memory cell having a charge-trap transistor.

In some implementations, each memory cell 704 may be a single-level cell (SLC) that has two possible memory states and thus can store one bit of data. As described above, the first memory state "0" may correspond to the first range of voltages, and the second memory state "1" may correspond to the second range of voltages. In some implementations, each memory cell 704 may be a multi-level cell (MLC) that is capable of storing more than a single bit of data in more than four memory states. For example, the MLC can store two bits per cell, three bits per cell (also known as a triple-level cell, TLC), or four bits per cell (also known as a quad-level cell, QLC). Each MLC can be programmed to assume a range of possible nominal storage values. In one example, when each MLC stores two bits of data, then the MLC can be programmed to assume one of three possible programming levels from an erased state by writing one of three possible nominal storage values to the memory cell. A fourth nominal storage value can be used for the erased state.

As shown in FIG. 7, each memory string 706 can include a source selection gate (SSG) transistor 708 at a source end and a drain selection gate (DSG) transistor 710 at a drain end. SSG transistor 708 and DSG transistor 710 can be configured to activate selected memory strings 706 (columns of the memory array) during reading and program operations. In some implementations, a source of each memory string 706 in the same block 703 may be coupled through one source line SL (i.e., a common SL). In other words, all memory strings 706 in one block may commonly own an array common source (ACS).

As shown in FIG. 6, SSG transistors 708 may be coupled through ground selection line GSL. DSG transistor 710 of each memory string 706 may be coupled, at one terminal, to a respective bit line BL from which data can be read or programmed via an output bus, according to some implementations. In some implementations, through a selection voltage (e.g., above the threshold voltage of DSG transistor 710) or deselected by applying a deselection voltage (e.g., 0 V) to a respective DSG transistor 710 through one or more string selection lines SSLs and/or by applying a selection voltage (e.g., above the threshold voltage of SSG transistor 708) or a deselection voltage (e.g., 0 V) to a respective SSG transistor 708 through one or more ground selection lines GSLs, a memory string 706 can be selected or deselected.

As described, memory cells 704 can be organized into multiple blocks 703. Each of blocks 703 can have a common source line SL. In some implementations, each block 703 may be the basic data unit for erase operations. That is, all memory cells 704 in the same block 703 can be erased at the same time. To erase memory cells 704 in a selected block, the common source line coupled to the selected block can be biased with an erase voltage (V e r s), such as a high positive potential (e.g., 20 V or more). It can be understood that, in other implementations, erase operations can be performed at a half-block level, a quarter-block level, or a level that impacts any suitable portion of memory cells 704 in one block.

Memory cells 704 of adjacent memory strings 706 in one block 703 can be coupled through word lines WLs that select which rows of memory cells 704 to be impacted at, e.g., read and program operations. In some implementations, each word line WL may be coupled to memory cells 704 of one page 712, which is the basic data unit for the program and read operations. The size of one page 712 in bits can correspond to the number of memory strings 706 coupled by one word line WL. Each word line WL may include a gate line configured to couple a plurality of control gates (gate electrodes) of each memory cell 704 in a respective page 712.

Figure 8:
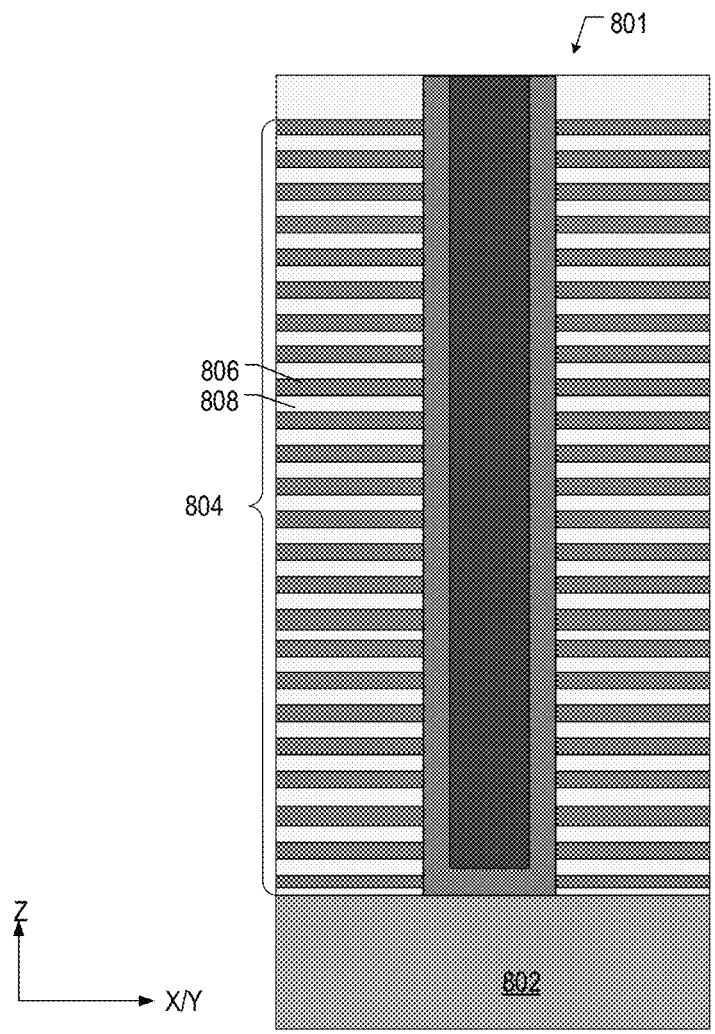
FIG. 8 is a cross-sectional view of a NAND memory string, according to some implementations of the present disclosure.

FIG. 8 is a cross-sectional view of a NAND memory string 801, according to some implementations of the present disclosure. As shown in FIG. 8, the NAND memory string 801 may extend vertically above a substrate 802 through a memory stack 804. Substrate 802 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

The memory stack 804 may include interleaved gate conductive layers 806 and gate-to-gate dielectric layers 808. The number of pairs of gate conductive layers 806 and gate-to-gate dielectric layers 808 in memory stack 804 may determine the number of memory cells 704 in memory cell array 702 in FIG. 7.

Gate conductive layers 806 may include a conductive material. The conductive material may include but is not limited to tungsten (W), cobalt (Co), Copper (Cu), aluminum (Al), polysilicon, doped silicon, silicide, or any combination thereof. In some implementations, each gate conductive layer 806 may include a metal layer, e.g., a tungsten layer. In some implementations, each gate conductive layer 806 may include a doped polysilicon layer. Each gate conductive layer 806 may include a control gate. The control gate may extend horizontally as, e.g., string select line SSL at the top of memory stack 804, ground selection line GSL at the bottom of memory stack 804, or a word line WL.

It is apparent that although not being shown in FIG. 8, the NAND memory string 801 may include other components, such as a slit structure, a local contact, an interconnect layer, and/or the like.

Figure 9:
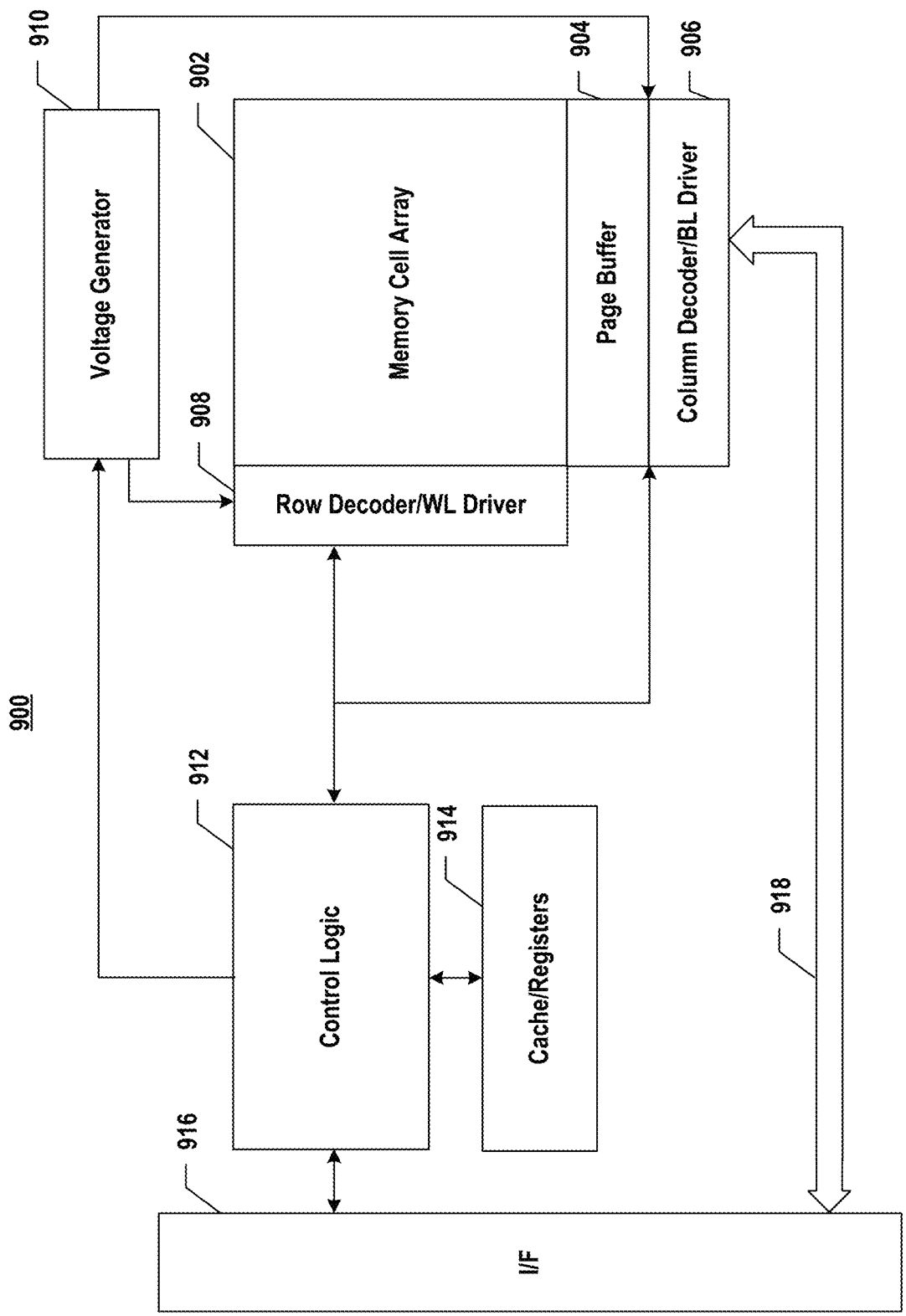
FIG. 9 illustrates a block diagram of an exemplary memory device including a memory cell array and peripheral circuits, according to some implementations of the present disclosure.

FIG. 9 illustrates a block diagram of an exemplary memory device 900 including a memory cell array 902 and peripheral circuits, according to some implementations of the present disclosure. Memory cell array 702 in FIG. 7 can be an example of memory cell array 902 in FIG. 9, while FIG. 9 may depict some examples of peripheral circuits 701 in FIG. 7.

Returning to FIG. 7, peripheral circuits 701 can be coupled with memory cell array 702 through bit lines BLs, word lines WLs, source line SL, string selection line SSL, and ground selection line GSL, etc. Peripheral circuits 701 can include any suitable circuits for facilitating the operations of memory cell array 702 by applying and sensing voltage signals and/or current signals through bit lines BLs to and from each target memory cell 704 through bit lines BLs, word lines WLs, source line SL, string selection line SSL, and ground selection line GSL. Peripheral circuits 701 can include various types of peripheral circuitry formed using complementary metal-oxide-semiconductor (CMOS) technologies. For example, FIG. 9 illustrates some exemplary peripheral circuits 701 that may include a page buffer 904, a column decoder/bit line driver 906, a row decoder/word line driver 908, a voltage generator 910, control logic 912, cache/registers 914, an interface (I/F) 916, and a data bus 918. It can be understood that in some examples, additional circuits may be included as well, such as a sensing amplifier.

Page buffer 904 can be configured to buffer data read from or programmed to memory cell array 902 according to control signals issued by control logic 912. In one example, page buffer 904 may store one page of program data (write data) to be programmed into one page 712 (shown in FIG. 7) of memory cell array 902. In another example, page buffer 904 may also perform program verification operations to ensure that the data has been properly programmed into memory cells 704 coupled to a selected word line.

Row decoder/word line driver 908 can be configured to be controlled by control logic 912 to select a block 703 of memory cell array 902 and a word line WL of selected block 703. Row decoder/word line driver 908 can be further configured to drive memory cell array 702. For example, row decoder/word line driver 908 may drive memory cells 704 coupled to the selected word line using a voltage generated from voltage generator 910.

Column decoder/bit line driver 906 may be controlled by control logic 912 to select one or more memory strings 706 (shown in FIG. 7) by applying a bit line voltage generated from voltage generator 910. For example, column decoder/bit line driver 906 may apply column signals for selecting a set of N bits of data from page buffer 904 to be outputted in a read operation.

Control logic 912 can be coupled to each peripheral circuit 701 (shown in FIG. 7) and configured to control operations of peripheral circuits 701. In some implementations, control logic 912 may issue control signals for controlling peripheral circuits to perform programming loop and voltage determinations according to the present disclosure.

Cache/registers 914 can be coupled to control logic 912 and may include status registers, command registers, and address registers for storing status information, command operation codes (OP codes), and command addresses for controlling the operations of each peripheral circuit 701. In accordance with the scope of the present disclosure, data (e.g., the first preset value, the second preset value, etc.) may be buffered in cache/registers 914 for subsequent usage. In some implementations, the initial verification loop number Nx for the memory cells to be programmed to the Lx target state may be acquired from cache/registers 914 of memory device 900.

Interface 916 can be coupled to control logic 912 and configured to interface memory cell array 902 with a memory controller. In some implementations, interface 916 may function as a control buffer to buffer and relay control commands received from the memory controller and/or a host to control logic 912 and status information received from control logic 912 to the memory controller and/or the host. Interface 916 can also be coupled to page buffer 904 and column decoder/bit line driver 906 via data bus 918 and function as an I/O interface and a data buffer to buffer and relay the program data received from the memory controller and/or the host to page buffer 904 and the read data from page buffer 904 to the memory controller and/or the host. In some implementations, interface 916 and data bus 918 can be parts of an I/O circuit of peripheral circuits 701.

Voltage generator 910 may be controlled by control logic 912 to generate word line voltages (e.g., read voltage, programming voltage, pass voltage, local voltage, and verification voltage) and bit line voltages to be supplied to memory cell array 702. In some implementations, voltage generator 910 can be part of a voltage source that provides voltages at various levels of different peripheral circuits 701 as described below in detail. Consistent with the scope of the present disclosure, in some implementations, the voltages provided by voltage generator 910, for example, to row decoder/word line driver 908, column decoder/bit line driver 906, and page buffer 904 may be above certain levels that can be sufficient to perform the memory operations. In some implementations, voltage generator 910 may be further configured to generate programming voltages and pass voltages supplied to control terminals of the memory cells 704. In some implementations, voltage generator 910 may be further configured to generate bit-line programming inhibition voltages and bit-line programming voltages to achieve the program operation methods in accordance with the scope of the present disclosure.

Figure 10:
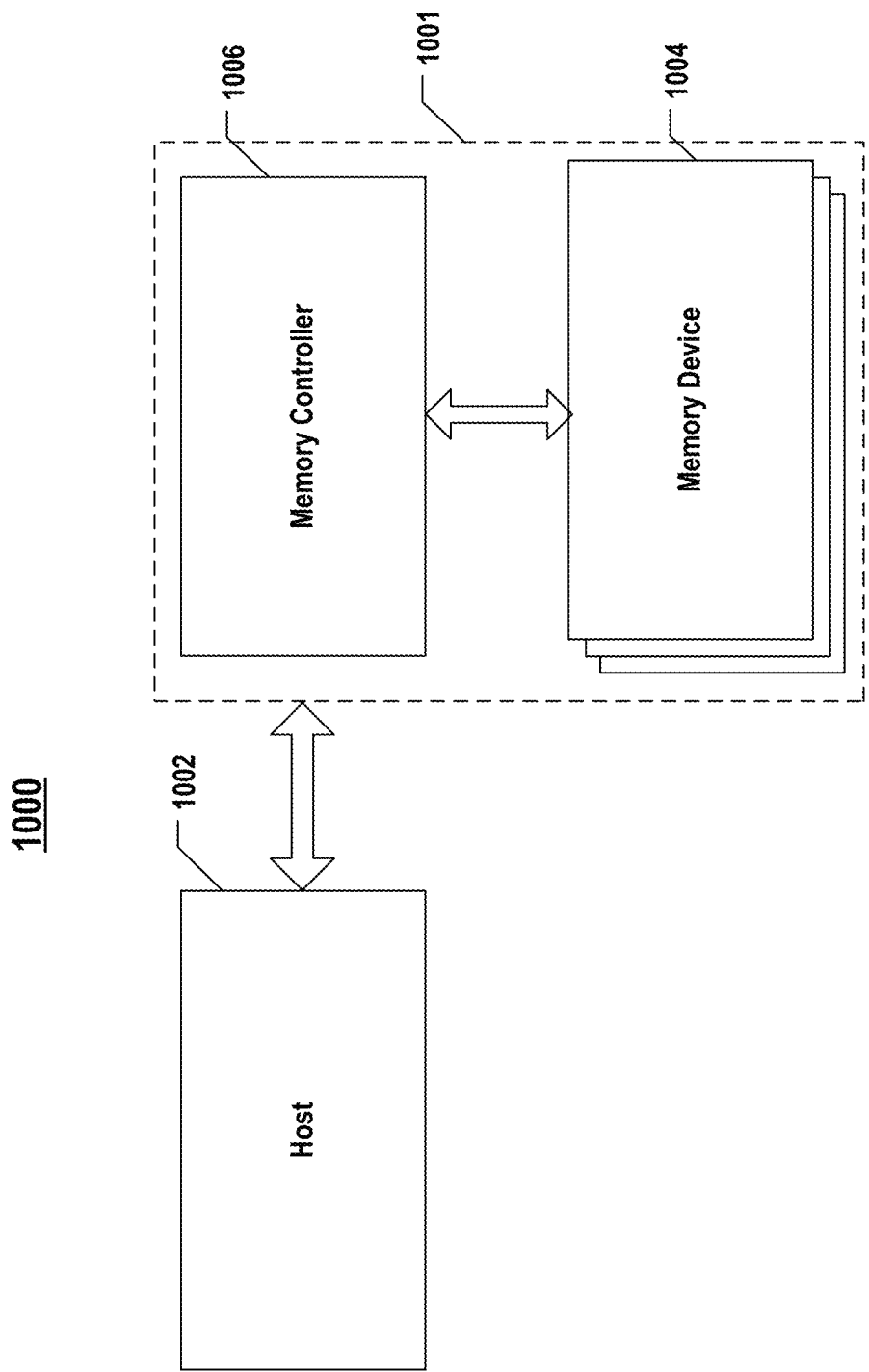
FIG. 10 illustrates a block diagram of an exemplary memory system having a storage system, according to some implementations of the present disclosure.

FIG. 10 illustrates a block diagram of an exemplary memory system 1000 having a storage system 1001, according to some implementations of the present disclosure. Memory system 1000 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 10, memory system 1000 can include a host 1002 and storage system 1001 having one or more memory devices 1004 and a memory controller 1006. Host 1002 can be a processor of an electronic device (such as a central processing unit, CPU), or a system-on-chip (SoC) (such as an application processor, AP). In some implementations, host 1002 can be configured to send or receive data to or from memory devices 1004. In some implementations, host 1002 can be a user logic, or a user interface such that the user may give instructions to host 1002 and transmit the instructions to the memory devices or the memory array.

Memory device 1004 can be any memory device disclosed in the present disclosure. As disclosed below in detail, memory device 1004, such as NAND Flash memory device, dynamic random access memory (DRAM), or phase-change random access memory (PCRAM) can include a clock input, a command bus, a data bus, a control logic, an address register, a row decoder/word line driver, a memory cell array having memory cells, a voltage generator, a page buffer/sense amplifier, a column decoder/bit line driver, a data input/output (I/O), according to some implementations.

Memory controller 1006 may be coupled to memory device 1004 and host 1002 and may be configured to control memory device 1004, according to some implementations. Memory controller 1006 can manage the data stored in memory device 1004 and communicate with host 1002. In some implementations, memory controller 1006 may be designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1006 may be designed for operating in a high duty-cycle environment solid-state drives (SSDs) or embedded multi-media-cards (eMMCs) used as data storage for mobile devices, such as smartphones, tablets, laptop computers, etc., and enterprise storage arrays. Memory controller 1006 can be configured to control operations of memory device 1004, such as read, erase, and write operations. Memory controller 1006 can also be configured to manage various functions with respect to the data stored or to be stored in memory device 1004 including, but not limited to bad-block management, garbage collection, logical-to-physical address conversion, wear leveling, etc. In some implementations, memory controller 1006 may be further configured to process error correction codes (ECCs) with respect to the data read from or written to memory device 1004. Memory controller 1006 may perform any other suitable functions as well, for example, formatting memory device 1004. Memory controller 1006 can communicate with an external device (e.g., host 1002) according to a particular communication protocol. For example, memory controller 1006 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc. Furthermore, memory controller 1006 can also be configured to receive a command from, transmit data to host 1002, and perform multiple functions according to some implementations of the present disclosure.

Figure 11A:
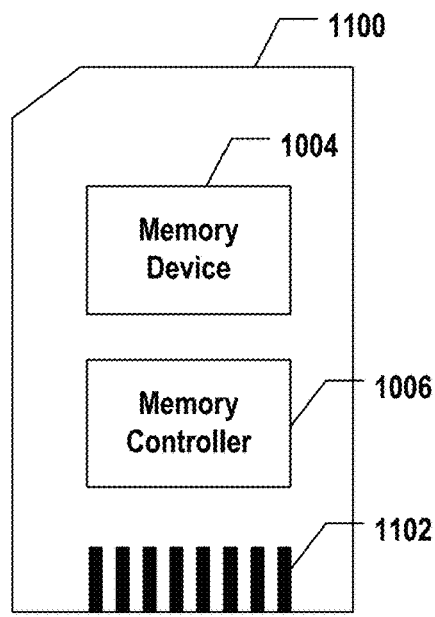
FIG. 11A illustrates a diagram of an exemplary memory card having a memory device, according to some implementations of the present disclosure.
Figure 11B:
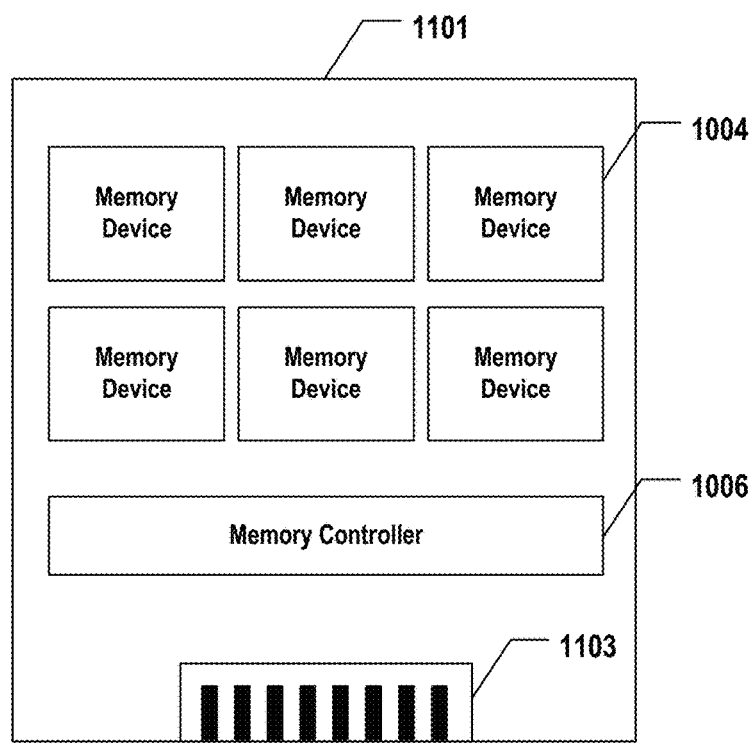
FIG. 11B illustrates a diagram of an exemplary solid-state drive (SSD) having a plurality of memory devices, according to some implementations of the present disclosure.

Memory controller 1006 and one or more memory devices 1004 can be integrated into various types of storage devices, for example, being included in the same package, such as a universal Flash storage (UFS) package or an eMMC package. That is, memory system 1000 can be implemented and packaged into different types of end electronic products. In one example as shown in FIG. 11A, memory controller 1006 and a single memory device 1004 may be integrated into a memory card 1100. Memory card 1100 can include a PC card (personal computer memory card international association, PCMCIA), a CF card, a smart media (SM) card, a memory stick, a multimedia card (MMC, RS-MMC, MMCmicro), an SD card (SD, miniSD, microSD, SDHC), a UFS, etc. Memory card 1100 can further include a memory card connector 1102 coupling memory card 1100 with a host (e.g., host 1002 in FIG. 10). In another example as shown in FIG. 11B, memory controller 1006, and multiple memory devices 1004 may be integrated into an SSD 1101. SSD 1101 can further include an SSD connector 1103 coupling SSD 1101 with a host (e.g., host 1002 in FIG. 10). In some implementations, the storage capacity and/or the operation speed of SSD 1101 can be greater than those of memory card 1100.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, rearranged with one another, and in ways that are consistent with the scope of the present disclosure.

What is claimed is:

1. A method of program operation performed on a memory device, comprising:
    at an $i^{th}$ programming loop, in response to determining that index i is greater than or equal to a first preset value and less than an initial verification loop number corresponding to a target state of memory cells in the memory device, performing an $i^{th}$ programming inhibition operation on the memory cells of the target state, index i being a positive integer, and the initial verification loop number indicating a programming loop number that starts a verification operation corresponding to the target state of the memory cells.

2. The method of claim 1, wherein at the $i^{th}$ programming loop, performing the $i^{th}$ programming inhibition operation on the memory cells comprises, at the $i^{th}$ programming loop, applying an $i^{th}$ bit-line programming inhibition voltage to bit lines coupled to the memory cells to be programmed to the target state.

3. The method of claim 1, further comprising:
    at the $i^{th}$ programming loop, in response to determining that index i is greater than or equal to 1 and less than the first preset value, performing an $i^{th}$ program operation on the memory cells of the target state.

4. The method of claim 1, further comprising:
    at the $i^{th}$ programming loop, in response to determining that index i is equal to the initial verification loop number:
        performing an $i^{th}$ program operation on the memory cells; and
        after the $i^{th}$ program operation is performed, performing an $i^{th}$ verification operation on the memory cells.

5. The method of claim 4, wherein:
    at the $i^{th}$ programming loop, performing the $i^{th}$ program operation on the memory cells comprises at the $i^{th}$ programming loop, applying an $i^{th}$ bit-line programming voltage to bit lines coupled to the memory cells to be programmed to the target state.

6. The method of claim 1, wherein the first preset value is identical for all target states of memory cells in the memory device.

7. The method of claim 1, wherein the first preset value comprises a difference between the initial verification loop number and a second preset value, where the second preset value comprises a positive integer.

8. The method of claim 7, wherein the second preset value comprises an integer selected from 1 to 5.

9. The method of claim 1, wherein:
    the initial verification loop number is a first initial verification loop number, and the target state is a first target state;
    the first preset value comprises a second initial verification loop number; and
    the second initial verification loop number indicates a programming loop number that starts a verification operation corresponding to a second target state of memory cells in the memory device, the second target state being a state lower than the first target state.

10. A memory device, comprising:
    a plurality of memory cells; and
    peripheral circuits coupled to the plurality of memory cells and configured to:
        at an $i^{th}$ programming loop, in response to determining that index i is greater than or equal to a first preset value and less than an initial verification loop number corresponding to a target state of memory cells in the memory device, perform an $i^{th}$ programming inhibition operation on the memory cells of the target state, index i being a positive integer, and the initial verification loop number indicating a programming loop number that starts a verification operation corresponding to the target state of the memory cells.

11. The memory device of claim 10, wherein the peripheral circuits are further configured to:
at the $i^{th}$ programming loop, apply an $i^{th}$ bit-line programming inhibition voltage to bit lines coupled to the memory cells to be programmed to the target state.

12. The memory device of claim 10, wherein the peripheral circuits are further configured to:
at the $i^{th}$ programming loop, in response to determining that index i is greater than or equal to 1 and less than the first preset value, perform an $i^{th}$ program operation on the memory cells of the target state.

13. The memory device of claim 10, wherein the peripheral circuits are further configured to:
in response to determining that, at a $p^{th}$ programming loop, the memory cells to be programmed to the target state reach the target state and pass a verification operation, perform a $(p+1)^{th}$ programming inhibition operation on the memory cells of the target state at a $(p+1)^{th}$ programming loop, p being a positive integer greater than the initial verification loop number.

14. The memory device of claim 10, wherein the peripheral circuits are further configured to, at the $i^{th}$ programming loop, in response to determining that index i is equal to the initial verification loop number:
perform an $i^{th}$ program operation on the memory cells; and
after the $i^{th}$ program operation is performed, perform an $i^{th}$ verification operation on the memory cells.

15. The memory device of claim 14, wherein the peripheral circuits are further configured to:
at the $i^{th}$ programming loop, apply an $i^{th}$ bit-line programming voltage to bit lines coupled to the memory cells to be programmed to the target state.

16. The memory device of claim 15, wherein:
the $i^{th}$ bit-line programming voltage comprises a voltage level lower than a $q^{th}$ bit-line programming inhibition voltage in a $q^{th}$ programming inhibition operation, q being a positive integer.

17. The memory device of claim 10, wherein the first preset value is identical for all target states of memory cells in the memory device.

18. The memory device of claim 10, wherein the first preset value comprises a difference between the initial verification loop number and a second preset value, where the second preset value comprises a positive integer.

19. The memory device of claim 10, wherein:
the initial verification loop number is a first initial verification loop number, and the target state is a first target state;
the first preset value comprises a second initial verification loop number; and
the second initial verification loop number indicates a programming loop number that starts a verification operation corresponding to a second target state of memory cells in the memory device, the second target state being a state lower than the first target state.

20. A method of program operation performed on a memory device, comprising:
acquire a range comprising a lower bound and an upper bound, each of the lower and upper bounds comprising a positive integer, the upper bound being greater than or equal to the lower bound and comprising an initial verification loop number minus 1, and the initial verification loop number indicating a programming loop number that starts a verification operation corresponding to a target state of memory cells; and
perform a programming inhibition operation on the memory cells of the target state for each programming loop from a $p^{th}$ programming loop to a $q^{th}$ programming loop, wherein p is equal to the lower bound, and q is equal to the upper bound.

* * * * *